United States Patent
Wohl et al.

(10) Patent No.: US 7,814,444 B2
(45) Date of Patent: Oct. 12, 2010

(54) SCAN COMPRESSION CIRCUIT AND METHOD OF DESIGN THEREFOR

(75) Inventors: Peter Wohl, Williston, VT (US); John A. Waicukauski, Tualatin, OR (US); Sanjay Ramnath, San Jose, CA (US); Rohit Kapur, Cupertino, CA (US); Thomas W. Williams, Boulder, CO (US)

(73) Assignee: Synopsys, Inc., Mountain View, CA (US)

( * ) Notice: Subject to any disclaimer, the term of this patent is extended or adjusted under 35 U.S.C. 154(b) by 647 days.

(21) Appl. No.: 11/807,119

(22) Filed: May 25, 2007

(65) Prior Publication Data
US 2008/0256497 A1     Oct. 16, 2008

(51) Int. Cl.
*G06F 17/50*     (2006.01)
(52) U.S. Cl. ..................... 716/4; 716/1; 716/5
(58) Field of Classification Search .............. 716/1, 716/4, 5, 3; 326/38
See application file for complete search history.

(56) References Cited

U.S. PATENT DOCUMENTS

| | | | |
|---|---|---|---|
| 6,300,885 B1 * | 10/2001 | Davenport et al. | 341/50 |
| 6,829,740 B2 | 12/2004 | Rajski et al. | |
| 6,993,694 B1 | 1/2006 | Kapur et al. | |
| 7,159,161 B2 * | 1/2007 | Lee et al. | 714/738 |
| 7,395,473 B2 * | 7/2008 | Cheng et al. | 714/729 |
| 7,415,678 B2 * | 8/2008 | Gizdarski | 716/1 |
| 2004/0268181 A1 * | 12/2004 | Wang et al. | 714/30 |
| 2005/0268190 A1 | 12/2005 | Kapur et al. | |
| 2006/0064614 A1 | 3/2006 | Abdel-Hafez et al. | |

OTHER PUBLICATIONS

Rajski J. et al. "Convolutional Compaction of Test Responses", International Test Conference, 2003, pp. 745-754.
Wohl, P. et al. "X-Tolerant Compression and Application of Scan ATPG patterns in a BIST architecture", Proc. of International Test Conference, 2003, pp. 727-736.
Wohl, P. et al. "Minimizing the Impact of Scan Compression", VLSI Test Symposium, 2007, pp. 8.
Wohl, P. et al. "Design of Compactors for Signature-Analyzers in Built-In Self-Test", Proceedings of the IEEE International Test Conference, 2001, pp. 10.
Pandey, A.R. et al. "An Incremental Algorithm for Test Generation in Illinois Scan Architecture Based Designs", Proceedings of the 2002 Design, Automation and Test in Europe Conference and Exhibition (Date'02), pp. 8.

(Continued)

*Primary Examiner*—Sun J Lin
(74) *Attorney, Agent, or Firm*—Silicon Valley Patent Group LLP; Omkar Suryadevara

(57) ABSTRACT

A scan-based circuit includes a selector that is implemented by multiple observation logics. Each observation logic is coupled to a scan chain to receive data to be supplied to a combinational compressor. Each observation logic is also coupled to a single input line in a corresponding group of input lines of the combinational compressor, to selectively supply data from the coupled scan chain. Each observation logic may be coupled to additional input lines (if present) in the corresponding group. The selector is operable on a per-shift basis in (a) transparent mode wherein data is supplied to all input lines and (b) several direct modes wherein data from only one scan chain is supplied at each compressor output without overlap.

17 Claims, 19 Drawing Sheets

OTHER PUBLICATIONS

Lee, K-J. et al. "Broadcasting Test Patterns to Multiple Circuits", IEEE Transactions on Computer-aided Design of Integrated Circuits and Systems, vol. 18, No. 12, Dec. 1999, pp. 1793-1802.

Hetherington, G. et al. "Logic for Large Industrial Designs: Real Issues and Case Studies", International Test Conference, 1999, pp. 358-367.

Barnhart, C. et al. "OPMISR: The Foundation for Compressed ATPG Vectors", International Test Conference, 2001, pp. 748-757.

Hamzaoglu, I. et al. "Reducing test application time for full scan embedded cores", Dig. Papers, $29^{th}$ Int. Symp. Fault-Tolerant Computing, 1999, pp. 8.

Hsu, F.F. et al. "A Case Study on the Implementation of the Illinois Scan", International Test Conference, 2001, pp. 538-547.

Krishna, C.V. et al. "Adjustable Width Linear Combinational Scan Vector Decompression", International Conference on CAD, 2003, pp. 863-866.

Mitra, S. et al. "X-Compact an Efficient Response Compaction Technique for Test Cost Reduction", International Test Conference, 2002, pp. 311-320.

Mitra, S. et al. "X-tolerant Signature Analysis", International Test Conference, 2004, pp. 432-441.

Wohl, P. et al. "Analysis and Design of Optimal Combinational Compactors", VLSI Test Symposium, 2003, pp. 6.

Patel, J.H. et al. "Application of Saluja-Karpovsky Compactors to Test Responses with Many Unknowns", VLSI Test Symposium, 2003, pp. 107-112.

Lumetta, S.S. et al. "X-Codes: Theory and Applications of Unknowable Inputs", UIUC Center for Reliable and High-Performance Computing Technical Report CRHC-03-08, Aug. 2003, pp. 21.

Sharma, M. et al. "X-filter: Filtering unknowns from compacted test responses", International Test Conference, 2005, pp. 9.

Rajski J. et al. "Synthesis of X-Tolerant Convolutional Compactors", VLSI Test Symposium, 2005, pp. 6.

Ramnath, S. et al. "Test-model based hierarchical DFT synthesis", ICCAD IEEE/ACM International Conference, 2002, pp. 286-293.

Wu, D.M. et al. "H-DFT: A Hybrid DFT Architecture for Low-Cost High-Quality Structural Testing", International Test Conference, 2003, pp. 1229-1238.

Wohl, P. et al. "Efficient Compression and Application of Deterministic Patterns in a Logic BIST Architecture", Design Automation Conference, 2003, pp. 566-569.

Rajski, J. et al. "Embedded Deterministic Test for Low Cost Manufacturing Test", International Test Conference, 2002, pp. 301-310.

Wohl, P. et al. "Effective Diagnostics through Interval Unloads in a BIST Environment", Design Automation Conference, 2002, pp. 249-254.

Entire Prosecution History of U.S. Appl. No. 11/786,968, filed Apr. 13, 2007 by Peter Wohl et al.

\* cited by examiner

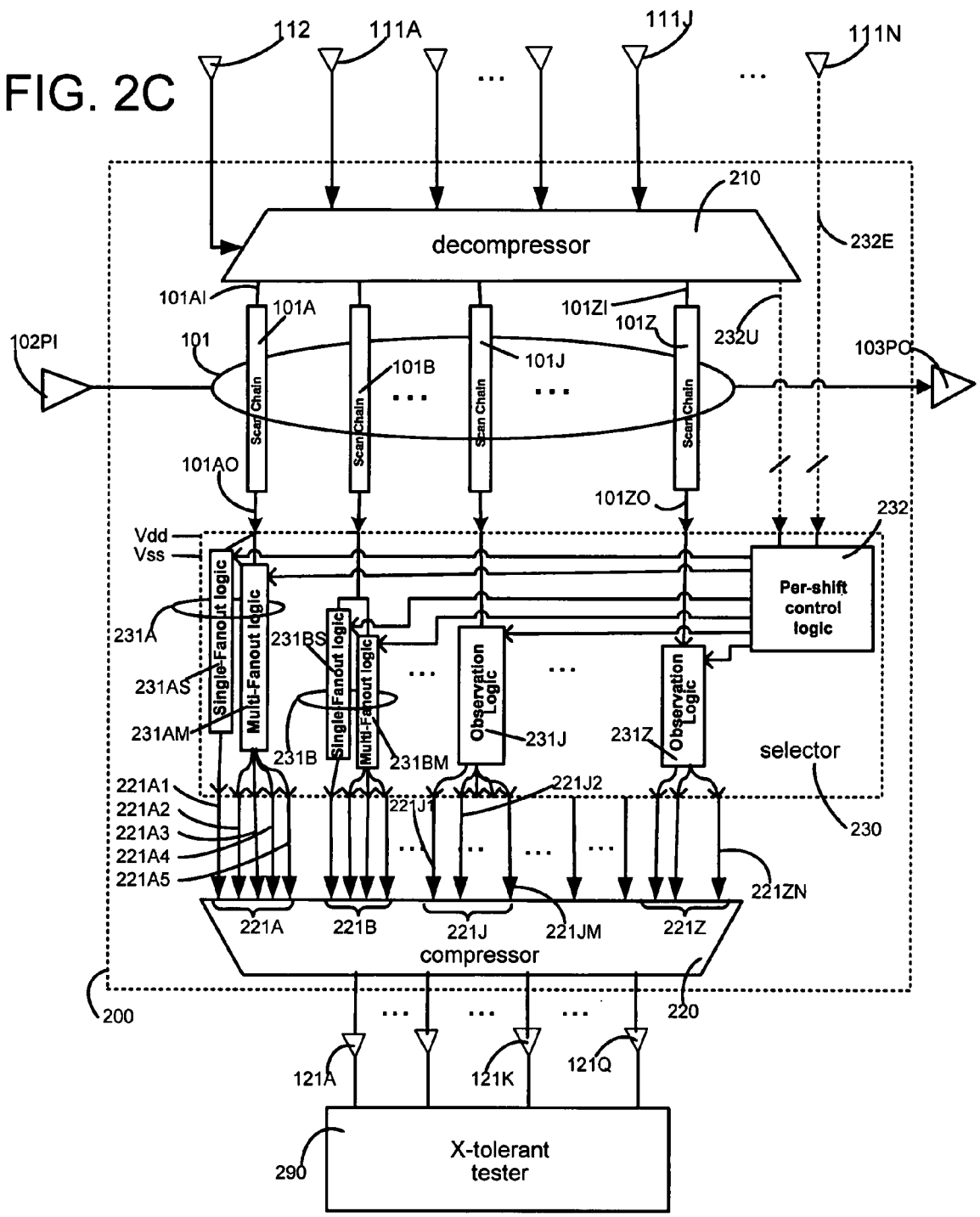

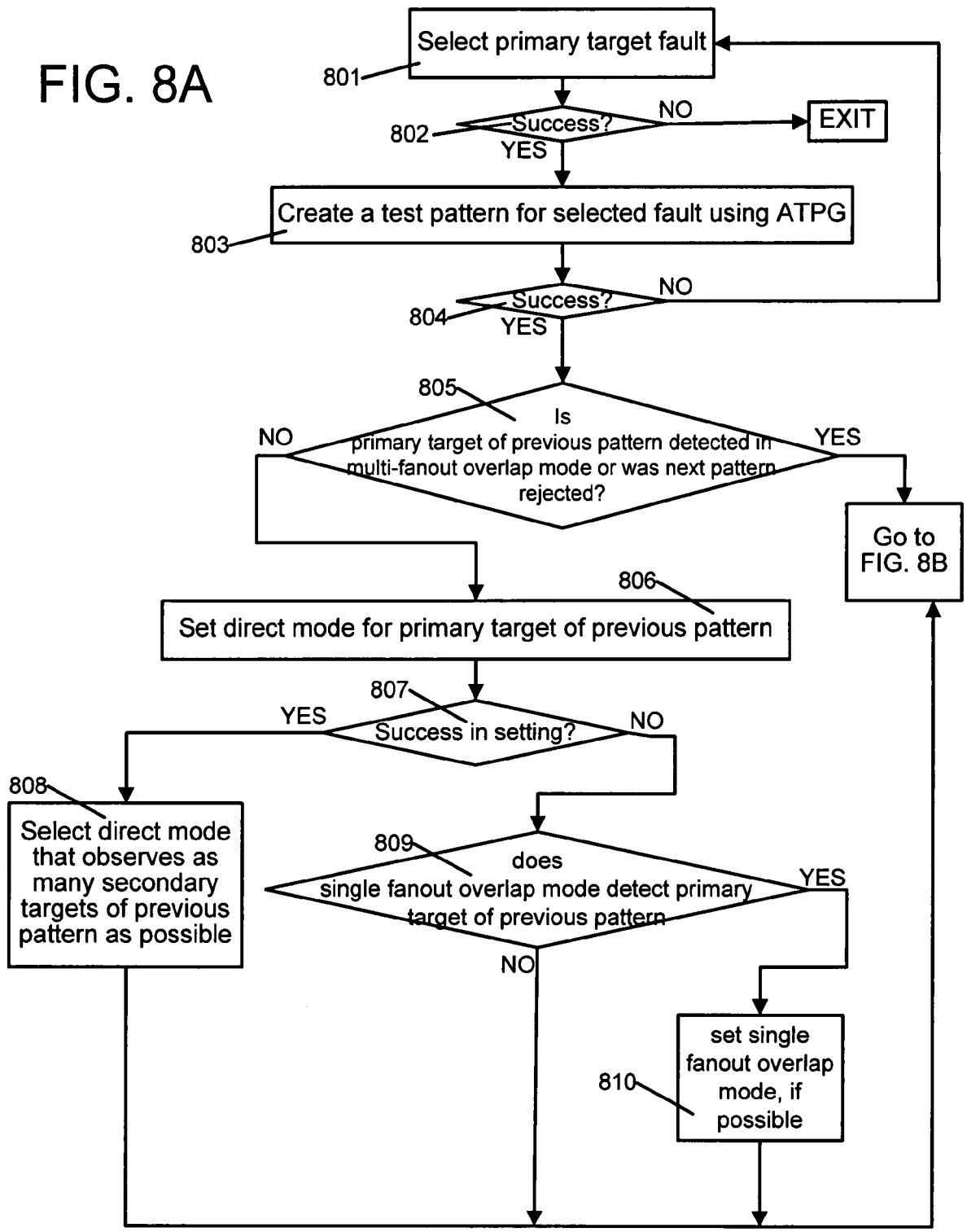

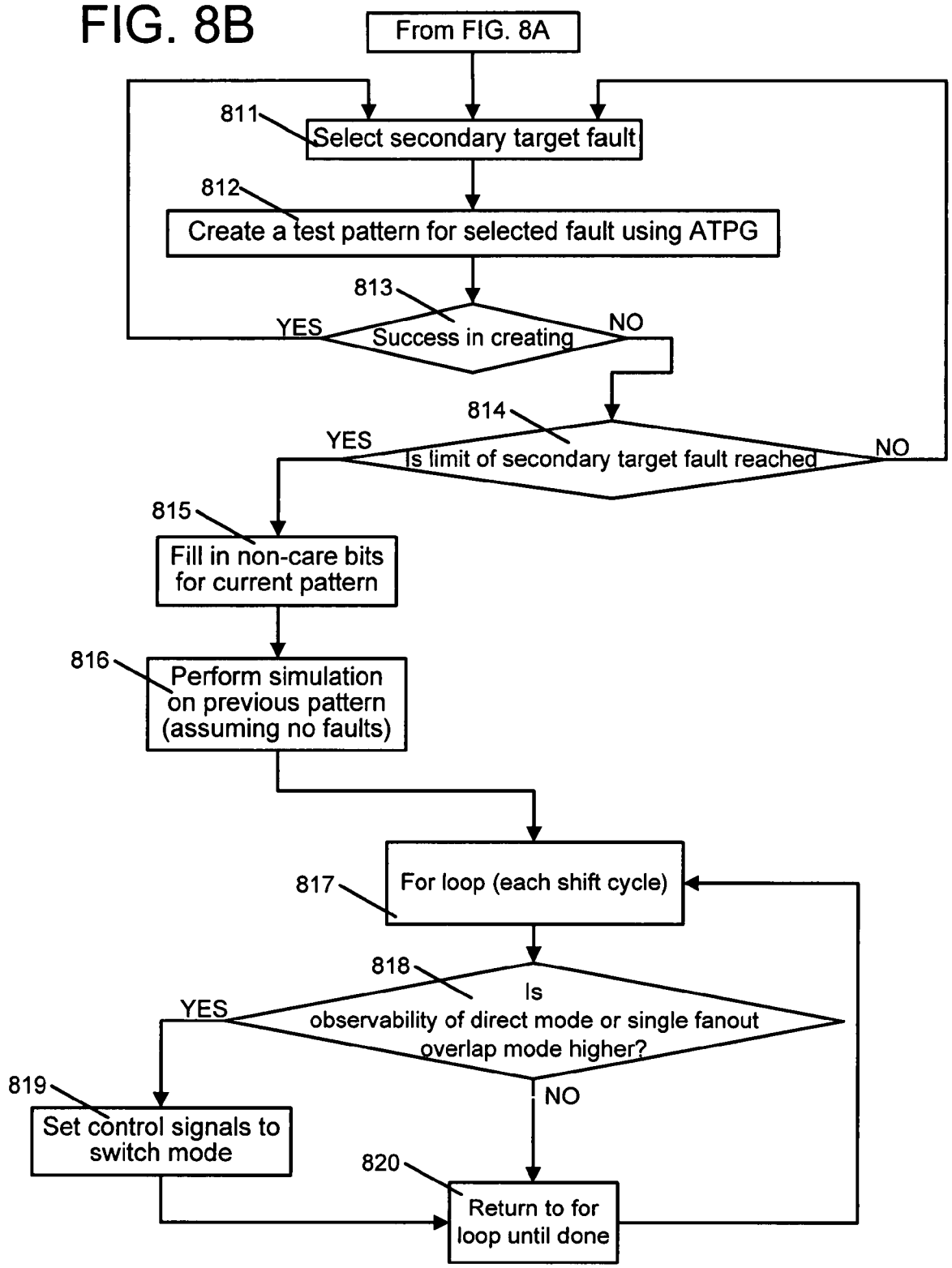

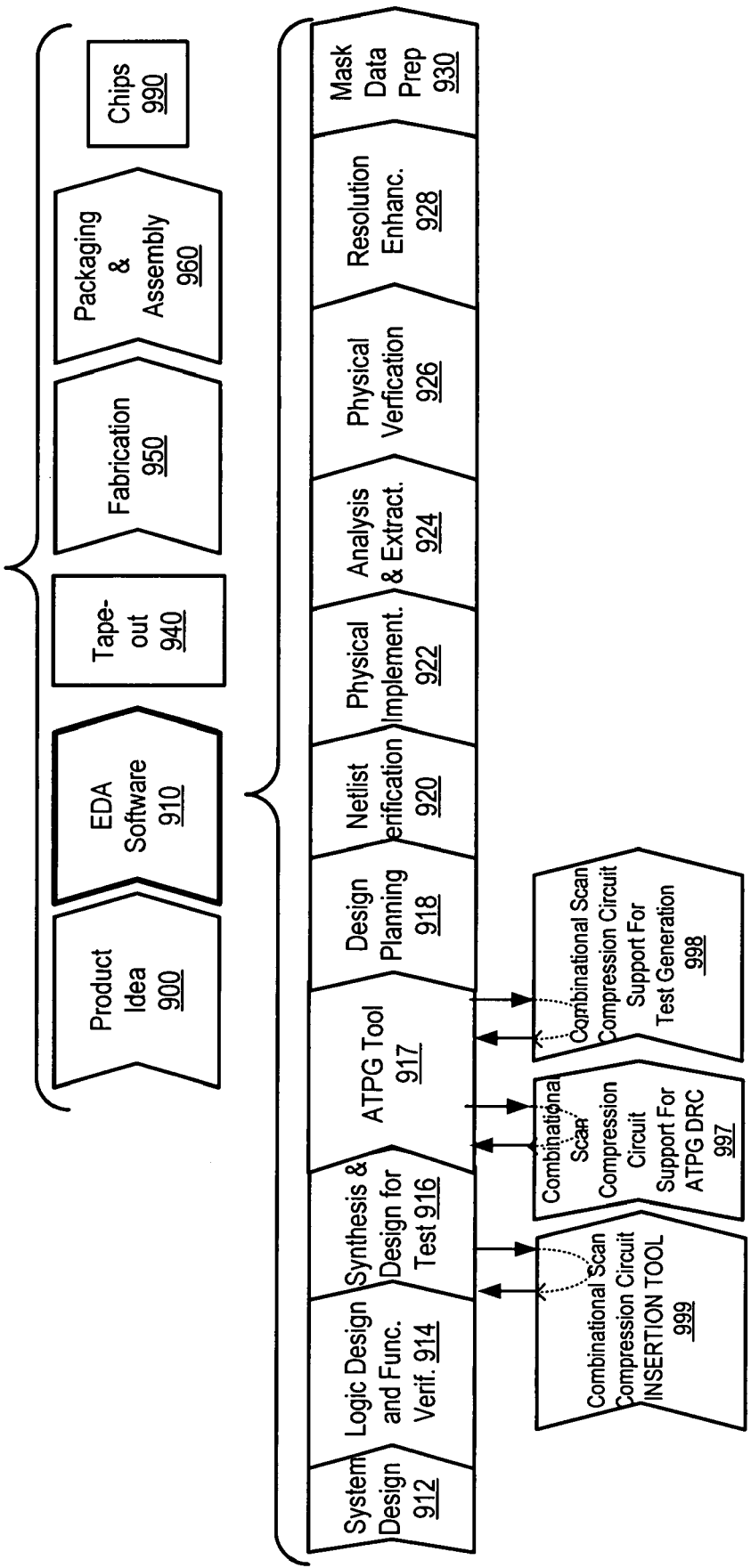

SCAN COMPRESSION CIRCUIT AND METHOD OF DESIGN THEREFOR

BACKGROUND

1. Field of the Invention

The invention relates to an architecture for a scan-based integrated circuit (IC). More specifically, the invention relates to a method and circuitry to perform scan compression using a selector operable on a per-shift basis, in multiple modes.

2. Related Art

Testing digital circuits accounts for a significant part of the cost to design, manufacture, and service electronic systems. Scan has long been the fundamental design-for-test (DFT) method to control test costs and aid silicon debug and fault diagnosis, but the number and size of scan test vectors is steadily increasing—even for highly compacted vector sets generated with modern automatic test pattern generation (ATPG).

A scan test pattern is shown by flow 10 in FIG. 1A. In flow 10, step 11 sets up the scan chain configuration using flip-flops in the design, thereby identifying the scan cells of the scan chain. Step 12 shifts the scan-in values into the active scan chains. Step 13 exits the scan configuration. Step 14 applies stimulus to the inputs of the logic to be tested (such as logic 101 in FIG. 1B), and measures the outputs. Step 15 pulses the clocks to capture the logic's response in the flip-flops. Step 16 sets up the scan chain configuration. Step 17 shifts the scan-out values from the active scan chains. Step 18 exits the scan configuration.

Cost-effective test requires a form of scan compression to address the issues of increasingly complex designs, large test pattern sets, and expensive and few automated test equipment (ATE) pads. Of particular interest are on-chip compression/decompression structures that only connect to scan chains and do not require Built-In Self-Test (BIST)-like design changes, such as unknown state (X) avoidance, input/output wrapper cells and improved random testability. Combinational methods are particularly attractive for their simplicity and low overhead in area, timing and design flow.

FIG. 1B illustrates a prior art electronic device which includes a circuit 100 that implements combinational scan compression (CSC). Accordingly, CSC circuit 100 includes a combinational decompressor 110, a combinational compressor 120, and a number of scan chains 101A-101Z coupled between combinational decompressor 110 and combinational compressor 120. Combinational decompressor 110 typically includes a number of multiplexers as shown in FIG. 1C (or exclusive OR gates). Similarly, combinational compressor 120 typically includes a number of exclusive OR gates as illustrated in FIG. 1D. Note that compressors are also called compactors in some prior art literature.

Referring back to FIG. 1B, CSC circuit 100 also includes a logic 101 to implement various features of functionality to be performed by the electronic device. Logic 101 typically includes a number of flip-flops that are required to implement the functionality. A subset of these same flip-flops are used, with multiplexers, to form scan cells that are organized into scan chains of the type shown in FIG. 1B. Specifically, flip-flops 101A1F and 101APF illustrated in FIG. 1E are portions of logic 101 that are made accessible via an external interface formed by input terminals 111A-111N, 112 and output terminals 121A-121Q of the electronic device, by use of multiplexers 101A1M and 101APM. Each corresponding pair, constituting a multiplexer driving a flip flop, forms a scan cell as shown in FIG. 1E.

Note that the primary input terminals 102PI and the primary output terminals 102PO of the logic 101 are physically identical to above-described input terminals 111A-111N, 112 and output terminals 121A-121Q of the external interface, but are shown separately in FIG. 1B to clearly show a distinction between scan mode operation and normal functional operation of CSC circuit 100. The difference between the two modes of operation is identified to CSC circuit 100 from an external source, via a scan enable signal on input terminal 112.

In FIG. 1A's step 11, using a scan_enable (i.e. a control) signal, multiplexers 101A1M and 101APM can be configured to allow scan-in values to be shifted into flip-flops 101A1F and 101APF without going through logic 101 in step 102. In step 103, multiplexers 101A1M and 101APM can be reconfigured to accept values from logic 101. At this point, stimulus can be applied to CSC circuit 100 in step 104. A pulse can be applied to the clock CLK terminals of flip-flops 101A1F and 101APF to capture the resulting values in step 105. In step 106, multiplexers 101A1M and 101APM can be reconfigured to shift those resulting values out through the scan chain comprising flip-flops 123. Step 108 marks the end of processing a single scan test pattern.

Scan load compression techniques exploit the low density of care bits in scan load data. Several combinational load compression methods have been proposed, including: ATE-based run-length encoding, ATE-independent shared scan-in "Illinois Scan", XOR-based expander networks inserted between scan input pins and internal scan chains, and MUX-based load decompressors. Scan unload compression techniques exploit the fact that error values appear more or less randomly, and only on a few scan chains at a time.

One issue with use of scan unload compression arises in the presence of unknown values (X) values. In "pure" scan designs which do not use any compression, presence of unknown values is normally handled by a tester which receives all values at output terminals 121A-121Q. The tester used with non-compression scan designs can be configured to ignore the unknown (X) values, and focus on evaluating non-X values. The location of the X values is typically known to an ATPG device which creates and loads test patterns into the tester. Specifically, the ATPG device configures the tester appropriately, on a scan chain by scan chain basis, and within each scan chain, on a scan cell by scan cell basis. However, in scan designs which use compression (or compaction) of some kind, an X value can be combined or otherwise mixed with one or more non-X values, by compressor 120 in a process called X-masking, which prevents tester 130 (FIG. 1B) from evaluating non-X values of interest.

Designs of scan compression in such presence of unknowns (Xs) may use circuitry to mask selected unload values so that Xs do not reach the unload compressor, or may selectively unload a subset of scan chains and mask unknown values at the tester. However, recent designs can often have more than two Xs per shift which exceeds the X-tolerance that can be ensured by the method of FIG. 1B. Several factors can contribute to increase the number of Xs per shift: (1) Increased functional complexity of recent designs results in extended usage of RAMs, which are X-sources for basic-scan ATPG. Area and performance considerations often prevent adding DFT structures to block the Xs from propagating to scan cells, thus the overall number of Xs increases. (2) Aggressive timing of designs creates a large number of false paths that are modeled by X-ing out the values captured in scan cells during test application, thus also increasing the number of Xs. (3) Higher compressions require increased number of internal scan chains, thus increasing the number of Xs per shift even if the total number of Xs remained unchanged. (4) Test cost reduction drives the number of available ATE pins down, either by using low-cost testers, or by employing multi-site testing. Fewer pins implies fewer X's per shift can be tolerated by a combinational compactor before loss of observability occurs.

Several designs of scan compression in presence of unknowns (Xs) are described in U.S. Pat. No. 6,829,740. Specifically, U.S. Pat. No. 6,829,740 granted to Rajski et al and entitled "Method and Apparatus for Selectively Compacting Test Responses" is incorporated by reference herein, in its entirety, as background. This patent discloses a linear compactor with selection circuitry for selectively passing test responses to the compactor. In one embodiment, gating logic is controlled by a control register, a decoder, and flag registers. This circuitry, in conjunction with any conventional parallel test-response compaction scheme, allows control circuitry to selectively enable serial outputs of desired scan chains to be fed into a parallel compactor at a particular clock rate. A first flag register determines whether all, or only some, scan chain outputs are enabled and fed through the compactor. A second flag register determines if the scan chain selected by the selector register is enabled and all other scan chains are disabled, or the selected scan chain is disabled and all other scan chains are enabled. Other embodiments disclosed by Rajski in this patent allow selective masking of a variable number of scan chain outputs.

Rajski's technique as described in U.S. Pat. No. 6,829,740 appears to be to block unknowns (Xs). The current inventors note that in such a technique, information about the precise location of all Xs needs to be transmitted from the ATPG device to the selector and/or compactor, but in doing so if the volume of information becomes large, the advantage of performing scan compression itself becomes annihilated. Additionally, the current inventors note that in blocking out all Xs, some non-X values may also be blocked which can be problematic if some of the non-X values happen to be data that needs to be observed.

Rajski also describes a class of finite memory compactors called "convolution compactors" designed specifically for Embedded Deterministic Test (EDT) in an article entitled "Convolution Compaction of Test Responses" by Janusz Rajski, Jerzy Tyszer, Chen Wang and Sudhakar M. Reddy, ITC International Test Conference, 2003, pp 745-754. This article is incorporated by reference herein in its entirety, as background. An example in Rajski's paper uses limited memory and lacks feedback, because of which the convolution compactors are capable of handling some number of X states. Rajski states that a single error from one scan cell is detected on the compactor outputs in the presence of a single X-state produced by another scan cell. Rajski further states that if multiple X states occur, the error propagation paths can be blocked and the error may not be observed at all.

The current inventors note that Rajski's above-described paper also appears to require information about the location of Xs to be transmitted from the ATPG device to the selector and/or compactor, which has several disadvantages as noted above.

In contrast to Rajski's techniques, an X-tolerant deterministic BIST architecture (called XDBIST) is described in an article by P. Wohl, J. Waicukauski, S. Patel and M. Amin entitled "X-Tolerant Compression and Application of Scan ATPG patterns in a BIST architecture," Proc. of International TestConference, pp. 727-736, 2003, which is incorporated by reference herein in its entirety. As stated in this article, XDBIST can tolerate any number of X's propagating to the scan chains, with no degradation in compression or application efficiency. Specifically, this article teaches reducing scan-out data by selectively observing only the desired scan chains by use of an observe selector. Chain selection is controlled by a separate selector register.

However, XDBIST requires sequentially loading X-avoiding data with every load. Accordingly, the current inventors note that both XDBIST and Rajski's technique suffer from the complexity and overhead of sequential elements. Also, both are limited to only one X-avoiding data selection per load, whereas the profile of Xs changes with every shift cycle of the load. Therefore, the current inventors believe that the selection of non-X data is too coarse, which can result in lower test quality and higher pattern count, i.e., lower compression. Finally, XDBIST allows only a fraction of the scan chains to be observed during each unload, which can also result in lower test quality and higher pattern count, i.e., lower compression.

Additionally, another BIST architecture for filtering X values output by scan chains is disclosed in U.S. Pat. No. 6,993,694 which is incorporated by reference herein in its entirety. The method described in this patent requires all X's to be eliminated before data can be compressed in a MISR. Depending on the tradeoff taken this can result in too much X-avoiding data, or too much masking of non-X data. In either case, the advantages of compression can be annihilated by the increased pattern count and data volume.

SUMMARY

An electronic device in accordance with the invention includes a scan-based circuit having a selector that is operable on a per-shift basis, in multiple modes. The selector is coupled between scan chains in the circuit, and a compressor.

Specifically, in most embodiments of the invention, each group of input lines of the compressor includes at least one line that is coupled individually to the selector and may further include one or more additional lines that are coupled in a fanout to the selector. The individually coupled line (also called "individual input line") can be used by the selector to supply data from the scan chain to the compressor independent of whether or not the same data is also being supplied on the additional input lines, and vice versa. Note that the selector can be implemented with (a) combinational elements only or (b) some combination of sequential elements and combinational elements, depending on the embodiment.

The just-described selector can be operated in at least the following modes: (1) a multi-fanout overlap mode wherein all input lines (regardless of individual or additional) receive data, and the data does overlap at the outputs of the compressor; and (2) one or more direct observation modes wherein only individual input lines of certain groups that are selected dynamically receive data, so that there is no overlap of data at the compressor's outputs. The selector may be designed to operate in other modes as well, depending on the specific embodiment, such as (3) a single-fanout overlap mode wherein only individual input lines receive data from corresponding scan chains and the additional input lines receive no data, but the data may overlap at the compressor's outputs.

Several embodiments apply control signals to such a scan-based circuit under the direction of a computer programmed with automatic test pattern generation (ATPG) software, to operate the selector in one of the above-described several modes. For example, if no unknowns exist, the computer uses the multi-fanout overlap mode (also called "transparent mode") to obtain the highest observability of scan unload data. If unknowns exist, depending on their extent and location relative to data of interest, the computer may use the single-fanout overlap mode (which can provide higher observability that a direct observation mode) or alternatively use a direct observation mode.

Use of a selector in the direct observation modes ensures that any data of interest in any scan cell can be extracted from the respective scan chain and supplied (transparently through the compressor) to a tester. Such a selector may be configured with any number of direct observation modes, depending on the number of scan chains and the number of outputs of the compressor. Hence several embodiments support observability in two dimensions: any particular scan cell (in the space dimension) and any particular shift cycle (in the time dimension), thereby to provide granularity at the lowest level known to the current inventors.

Use of combinational logic in some embodiments of the selector allows control on a per-shift basis easily. Moreover, a completely combinational implementation of the selector is significantly simpler and uses fewer gates, than certain prior art selectors that use sequential elements. The scan-based circuit also includes a compressor which has several groups of input lines that are coupled to the selector. The selector supplies data from a given scan chain in the electronic device selectively to one or more lines in the group of input lines.

BRIEF DESCRIPTION OF THE DRAWINGS

FIG. 2C illustrates, in a low-level block diagram, single-fanout logics and multi-fanout logics that are used in some embodiments to implement the observation logics of FIG. 2B.

FIGS. 8A and 8B together illustrate, in a flow chart, acts performed by a programmed computer in some embodiments.

FIG. 9B illustrates a simplified representation of an exemplary digital ASIC design flow that uses an insertion tool to modify an IC design, in accordance with the invention.

DETAILED DESCRIPTION

An electronic device in several embodiments of the invention includes a scan compression circuit 200 (FIG. 2A) having a selector 230 that is operable on a per-shift basis, in multiple modes. Scan-based circuit 200 also includes a compressor 220 which has several groups 221A-221Z of lines that are coupled to selector 230. Compressor 220 is architected in the normal manner, i.e. under an assumption that lines in each group carry the same data, namely data extracted from a respective one of scan chains 101A-101Z in the electronic device. Typically, each line within a group is connected internally within compressor 220 to a different block (e.g. implemented by an XOR gate) which combines data from lines of different groups. Hence, a compressor 220 which is used with selector 230 of some embodiments may be similar or identical to any compressor in the prior art, such as compressor 120 of FIG. 1D.

However, selector 230 does not supply identical signals to all lines within a group as expected by compressor 220. Instead, selector 230 supplies data only selectively on one or more lines within each group. To enable such a selective data supply, each group 221J of the compressor's input lines is divided into two sets that are independently coupled to selector 230, with a first set containing at least one input line 221J1, and a second set containing one or more additional input lines 221J2-221JM. In the embodiments illustrated in FIG. 2A, line 221J1 of the first set is coupled individually to selector 230, and lines 221J2-221JM of the second set are coupled in a fanout 221JF to selector 230.

Figure 2A:
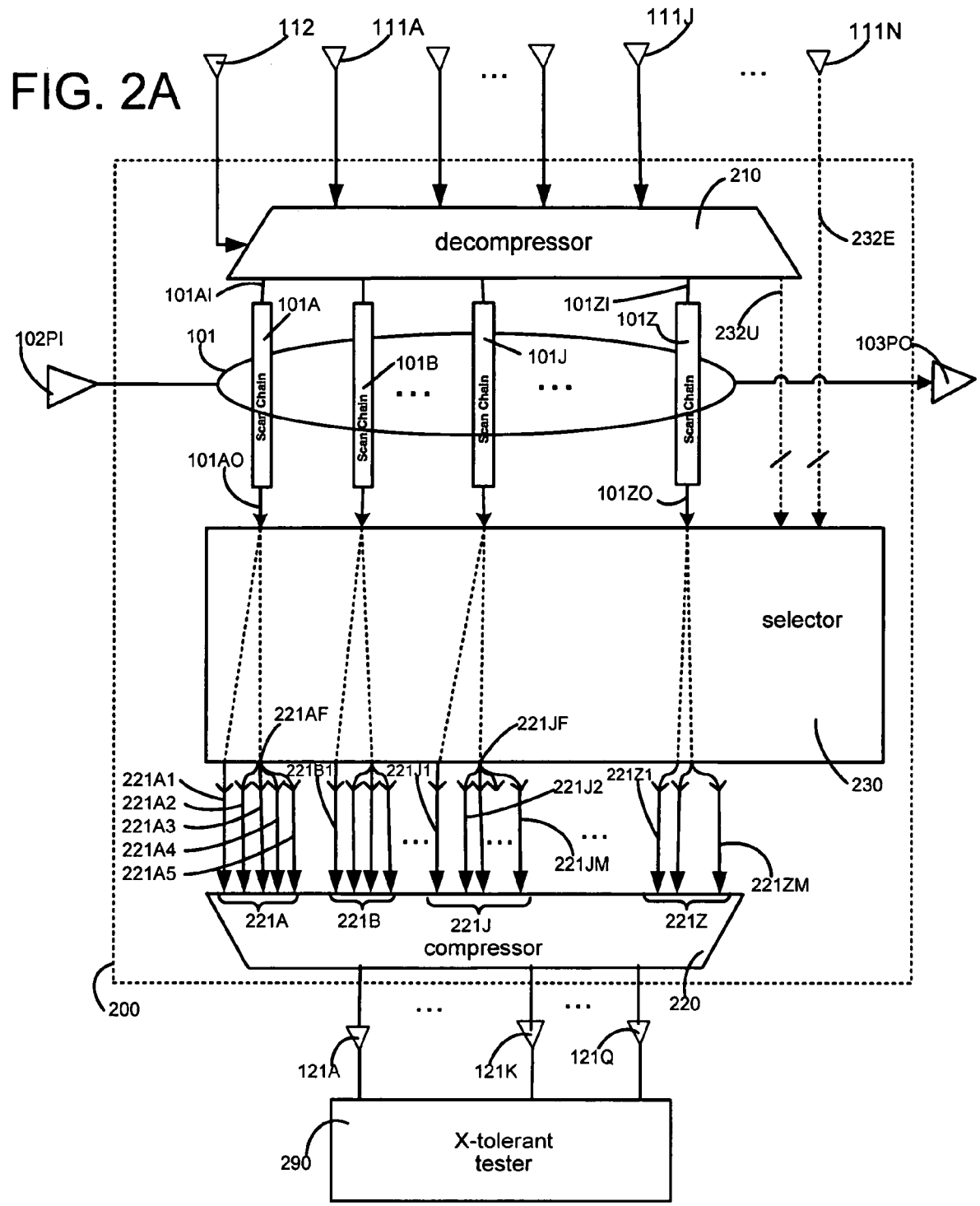
FIG. 2A illustrates, in a high-level block diagram, a selector that is coupled to groups of input lines of a compressor in accordance with the invention.

Referring to the embodiments illustrated in FIG. 2A, individually coupled input line 221J1 is used by selector 230 to supply data from scan chain 101J to compressor 220, independent of whether or not the same data is supplied on additional input lines 221J2-221JM. Supplying data to individual input line 221J1 supports direct, one-to-one transfer of data of interest from a specific scan chain 101J to a primary output 121K, for example if all remaining input lines (corresponding to other scan chains) are turned off (i.e. carry a signal that does not affect the data of interest within compressor 220). In this manner, any scan cell of interest, among all scan chains 101A-101Z in circuit 200, can be targeted by selector 230, for direct observation in an appropriate shift cycle.

Selector 230 (FIG. 2A) is operable in at least a multi-fanout overlap mode, wherein all input lines (regardless of individual or additional) in all groups 221A-221Z of compressor 220 are coupled to corresponding scan chains 101A-101Z. In this mode, data from all groups of input lines overlaps at the respective outputs of the compressor. This mode is used when the unknowns (Xs) in some of the scan chains 101A-101z do not mask observation of desired scan cells in other scan chains, whereby selector 230 operates transparently to enable the highest observability of unload data, from scan chains 101A-101Z to primary outputs 121A-121Q.

Selector 230 (FIG. 2A) is further operable in at least one or more direct observation modes, wherein only individual input lines of certain groups that are selected dynamically are coupled to corresponding scan chains. For example, if groups 221A, 221B and 221Z are selected then data is supplied only to their individual input lines 221A1, 221B1 and 221Z1, and this data in turn is supplied by compressor 220 without any overlap to primary outputs 121A, 121K and 121Q. To ensure no overlap, all remaining input lines (which not coupled to any scan chain) may be grounded—hence data from scan chains corresponding to the selected groups travels without transformation, to the primary outputs. In the just-described example, all additional input lines (e.g. lines 221A2-221A5) in each selected group (e.g. group 221A) are grounded, and furthermore all input lines of all unselected groups (e.g. group 221J) are also grounded.

Note that the various components of circuit 200 (FIG. 2A) can be implemented with any combination of sequential elements (such as flip-flops) and/or combinational elements (such as AND gates). In many embodiments of the type illustrated in FIG. 2A decompressor 210, selector 230 and compressor 220 are each implemented with only combinational elements, in which case each of these three components is fully combinational. In some embodiments of the type illustrated in FIG. 2A, one or more flip-flops may be present within one or more of these three components.

In some embodiments, selector 230 (FIG. 2A) can be operated in an optional mode called single-fanout overlap mode, wherein all individual input lines 221A1, 221B1 ... 221J1 ... 221Z1 are coupled to corresponding scan chains 101A, 101B ... 101J ... 101Z. In this mode, additional input lines in each group (such as lines 221A2-221A5 for group 221A) do not receive the data from the corresponding scan chains. Instead, the additional input lines are coupled to a source of predetermined voltage, such as Vss (e.g. the ground reference voltage, to signal logic level 0). In this mode, data from two or more individual input lines 221A1-221Z1 may overlap at an output of compressor 220 (e.g. data on lines 221A1 and 221B1 may be XORed by compressor 220 and supplied on primary output 121A). Note however, that in this mode, no data is supplied on the additional input lines. Note that the single-fanout overlap mode is optional, and hence this mode is not used in some embodiments of selector 230.

Use of a selector 230 (FIG. 2A) in the direct observation modes guarantees that any data of interest can be extracted from a scan chain and supplied (transparently through compressor 220) to a tester 290. Such a selector 230 may be configured with any number of direct-observation modes, depending on the number of scan chains and the number of outputs of the compressor. As selector 230 (FIG. 2A) is completely, its operation is easily controlled on a per-shift basis. Hence several embodiments support observability in two dimensions: any particular scan cell (in the space dimension) and any particular shift cycle (in the time dimension), thereby to provide granularity at the lowest level known to the current inventors.

In many embodiments, selector 230 is implemented by a number of logics 231A-231Z (FIG. 2B) which are equal in number to the number of groups 221A-221Z of input lines of compressor 220. The just-described logics 231A-231Z are also referred to as "observation logics." An observation logic 231J is coupled to a scan chain 101J to receive data to be supplied to compressor 220. Observation logic 231J (FIG. 2B) is also coupled to a corresponding group 221J of input lines of compressor 220. Specifically, observation logic 231J is coupled an individual input line 221J1 within the group 221J and may also be coupled in a fanout 221JF to one or more additional input lines 221J2-221JM (if present in group 221J).

In some embodiments, observation logic 231J (FIG. 2B) supplies data from its scan chain 101J to compressor 220 as per one of three states as follows. In a first state, observation logic 231J couples individual input line 221J1 in group 221J to the correspondingly coupled scan chain 101J, and further couples the additional input lines 221J2-221JM of group 221J to the Vss source (e.g. to ground). In a second state, the observation logic couples all input lines in group 221J to scan chain 101J. In a third state, observation logic 231J couples all lines in its group 221J to the Vss source, whereby no data from scan chain 101J can reach compressor 220. To summarize, compressor 220 receives a predetermined grouping of (a) voltage signal Vss and (b) data from scan chain, on the two sets within group 221J, depending on the state of observation logic 231J.

Selector 230 (FIG. 2B) also includes a logic 232 that controls operation of observation logics 231A-231Z within selector 230. Logic 232 is fully operable on a per-shift basis, i.e. is sensitive to changes in control signals received on lines 232U-232E in a given shift cycle and within the same shift cycle generates control signals to operate observation logics 231A-231Z. Accordingly this logic 232 is also referred to as a per-shift control logic. Lines 232U-232E which control operation of per-shift control logic 232 are designed to be limited in number, to allow operation of logic 232 to be controlled in every shift cycle. One such illustrative embodiment automatically computes the number of control lines to logic 232 as described below. Note that in several embodiments, there are no sequential elements between control logic 232 and primary inputs (e.g. 111J and 111N), and in these embodiments logic 232 is easily controlled on a per-shift basis. Accordingly, it will be apparent to the skilled artisan in view of this disclosure that control signals for logic 232 are not loaded across multiple shift cycles, unlike prior art.

As noted above, per-shift control logic 232 can supply different control signals in each shift cycle to each observation logic 231J to place it into an appropriate one of the three states described above. When all observation logics 231A-231Z are placed in the first state described in the previous paragraph, selector 230 operates in the above-described single-fanout overlap mode, wherein data from individual input lines may overlap at an output of the compressor. When all observation logics 231A-231Z are placed in the second state, selector 230 (FIG. 2B) operates transparently, and data from all input lines overlaps at the compressor's outputs, thereby to result in the above-described multi-fanout overlap mode.

Finally, certain observation logics are operated in the first state and selected for such operation to ensure no overlap of their data at the compressor's outputs, with remaining observation logics being operated in the third state, to result in a direct observation mode. Accordingly, several different direct observation modes are possible, depending on the number of combinations of observation logics that result in no overlap.

Use of the selector in one or more direct observation modes guarantees that any data of interest is supplied to the compressor. In several embodiments, a specific combination of observation logics to be operated in the first state is notified to per-shift control logic 232 by an external source via control lines 232U and 232E, such as a computer programmed with ATPG software (not shown in FIG. 2B, see FIG. 9A for such a computer). The just-described computer has information on the extent and location of X values relative to data of interest, and accordingly the computer 150 (FIG. 9A) uses the single-fanout overlap mode or uses a direct observation mode, whichever is appropriate to recover the data of interest.

Figure 2B:
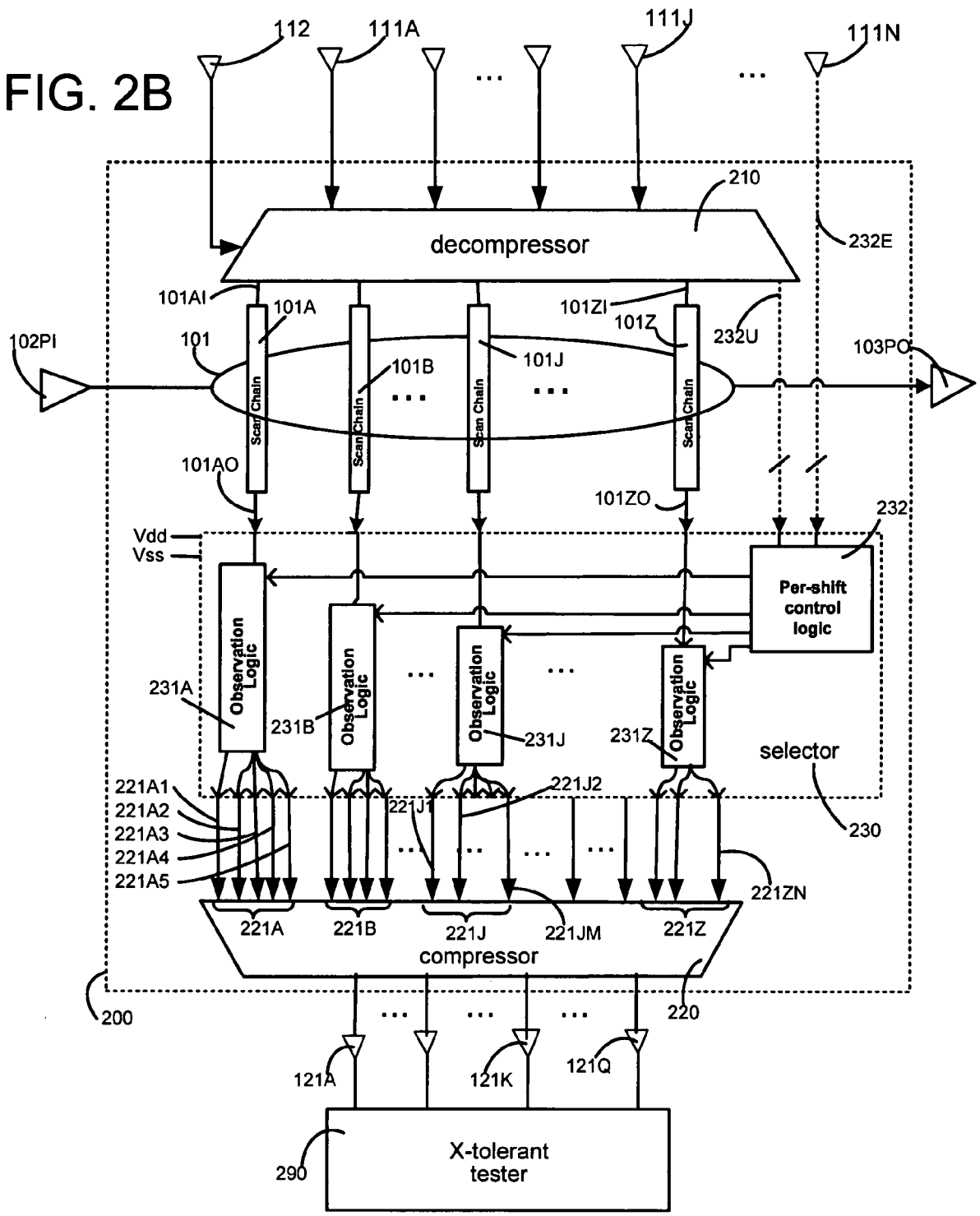
FIG. 2B illustrates, in an intermediate-level block diagram, observation logics used in many embodiments of the invention, to implement the selector of FIG. 2A.

As will be apparent to the skilled artisan from this description, direct observation modes ensure that data from any scan cell which needs to be observed is supplied to the compressor regardless of X values. Specifically, observation logics 231A-231Z do not block, suppress or otherwise filter any X values. Instead, observation logics 231A-231Z simply operate without considering (i.e. independent of) any X values, while ensuring that the data of interest is transferred to compressor 220. So, if some scan chains happen to contain X values, those X values may get transmitted by observation logics 231A-231Z to compressor 220. Presence of X values at the outputs of compressor 220 is handled by tester 290, in the normal manner. Specifically, tester 290 focuses on data of interest (and accordingly ignores X values). For this reason, selector 230 of the type shown in FIG. 2B is X-tolerant.

In some embodiments, observation logics 231A-231Z are each internally implemented by two logics as illustrated in FIG. 2C. Specifically, observation logic 231A is implemented by a single-fanout logic 231AS that is coupled to the individual input line 221A1 in group 221A, and by a multi-fanout logic 231AM that is coupled via a fanout to additional lines 221A2-221A5. Although only two pairs of logics 231AS, 231AM and 231BS, 231BM are illustrated in FIG. 2C as implementing the respective logics 231A and 231B, it is to be understood that all observation logics are implemented with a pair of single-fanout and multi-fanout logics. Note that each logic in a pair is coupled to the respective scan chain, e.g. logics 231AS, 231AM are both coupled to scan chain 101A, and logics 231BS, 231BM are both coupled to scan chain 101B.

Moreover, each logic in a pair is also coupled to per-shift control logic 232 (FIG. 2C) which can individually turn on or off each logic in the pair. Accordingly, to implement the single-fanout overlap mode, per-shift control logic 232 merely turns on (i.e. enables) all single-fanout logics 231AS-231ZS while turning off (i.e. disabling) all multi-fanout logics 231AM-231ZM. Similarly, to implement the multi-fanout overlap mode, per-shift control logic 232 turns on (i.e. enables) all logics 231AS-231ZS and 231AM-231ZM. Finally, to implement a direct observation mode, per-shift control logic 232 turns on one or more single-fanout logics 231AS, 231JS selectively, while turning off all remaining logics.

Figure 3A:
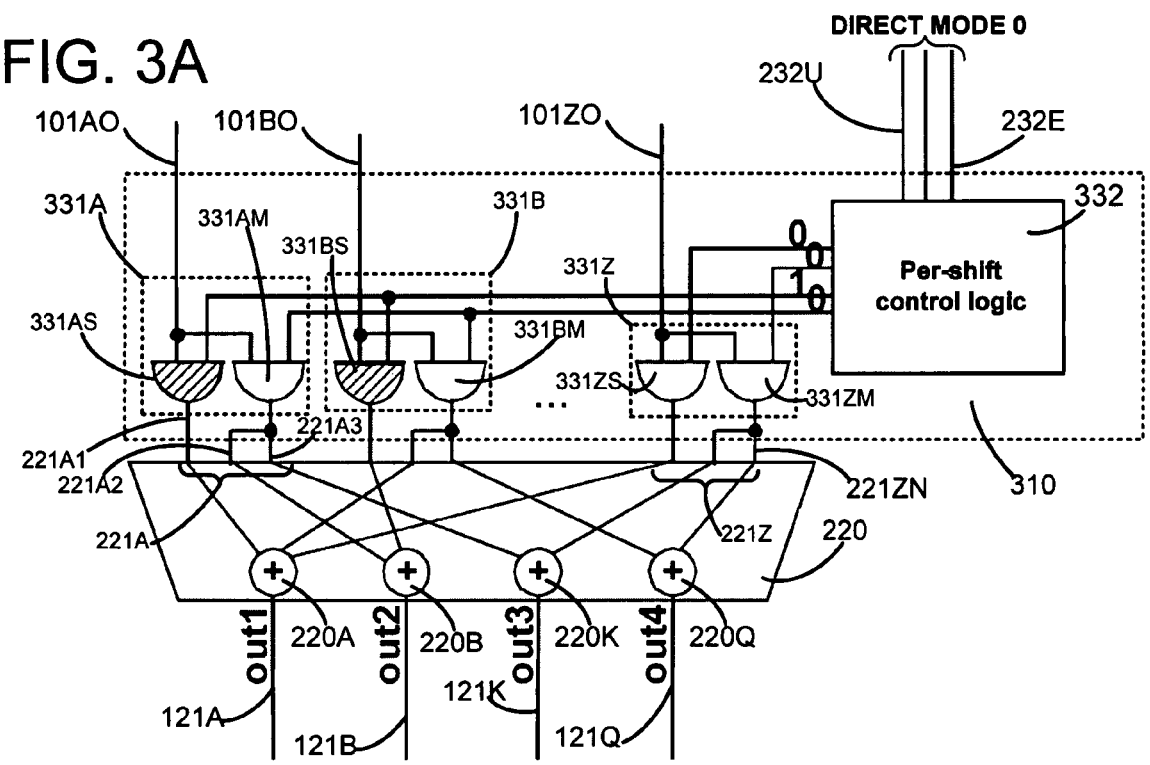
FIG. 3A illustrates use of AND gates to implement the single-fanout logics and multi-fanout logics of FIG. 2C in certain embodiments.

In one illustrative embodiment shown in FIG. 3A, observation logics 331A-331Z in selector 310 are implemented by AND gates. Specifically, each pair of single-fanout and multi-fanout logics is implemented by a corresponding pair of AND gates. For example, a first AND gate 331AS is coupled to individual input line 221A1 in group 221A, while a second AND gate 331AM is coupled via a fanout to additional lines 221A2 and 221A3. AND gates 331AS and 331AM are both coupled to line 101AO which is driven by scan chain 101A. Note that although a fanout from 101AO is shown located physically within observation logic 331A, such a fanout can be located anywhere between the AND gates and the scan chain. Similarly, although a fanout that drives additional lines 221A2 and 221A3 is shown within selector 310, this fanout too may be located elsewhere, e.g. within compressor 220.

Figure 3B:
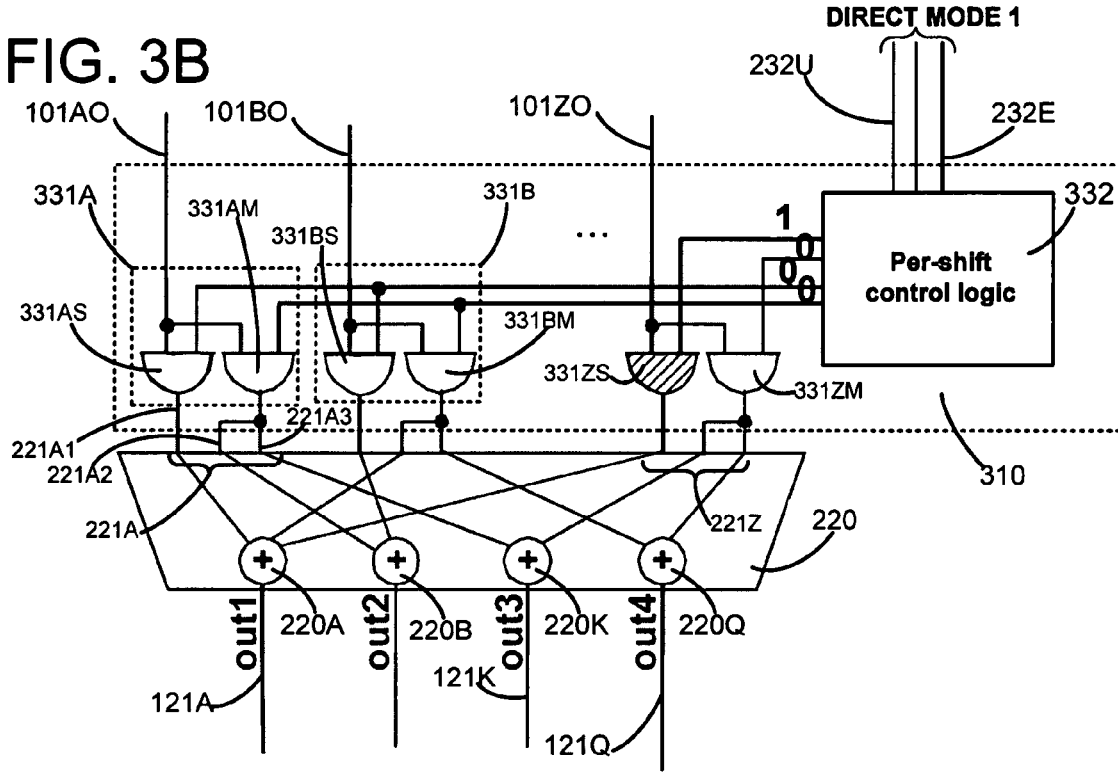
FIGS. 3B-3D show operation of the selector of FIG. 3A in different modes, which may occur in various shift cycles in an illustrative embodiment.
Figure 3C:
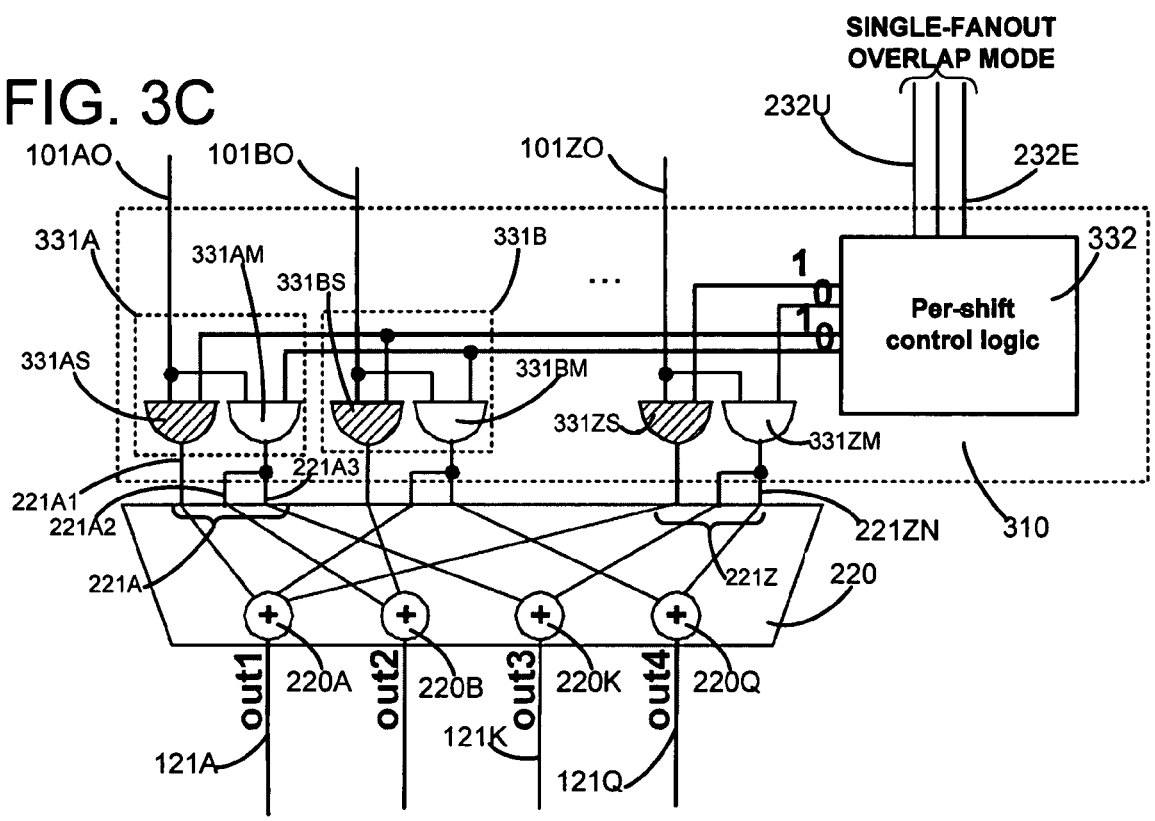
Figure 3D:
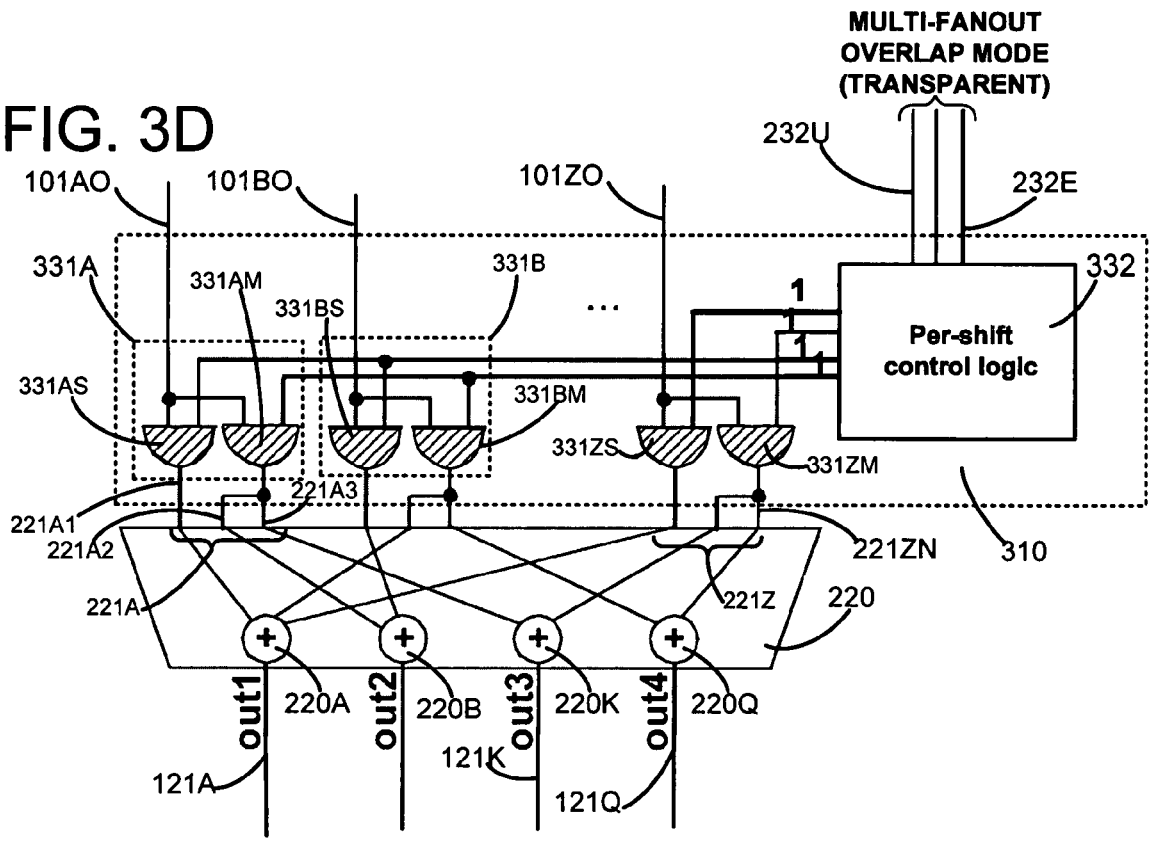

Note that in FIG. 3A, control logic 332 (which is an embodiment of per-shift control logic 232) is illustrated as supplying the signals 0, 0, 1, 0 (from top to bottom) to the observation logics 331A-331Z. These signals cause AND gates 331AS and 331BS to be turned on and the rest of the AND gates are turned off. Hence, these signals operate selector 310 in a direct mode wherein data from line 101AO flows without any transformation to output 121A, and similarly data from line 101BO flows without transformation to output 121B. FIG. 3B illustrates another direct mode, wherein data from line 101ZO flows without transformation to output 121A, in response to signals 1, 0, 0, 0 from control logic 332. In FIG. 3C, three AND gates have been turned on, by control logic 332 supplying signals 1, 0, 1, 0, to implement a single-fanout overlap mode. Finally, FIG. 3D illustrates the multi-fanout overlap mode wherein control logic 332 supplies signals 1, 1, 1, 1 which turns on all AND gates within observation logics 331A-331Z (i.e. selector 310 becomes transparent to the presentation of data from the scan chains to the compressor, as if it were non-existent).

Figure 3E:
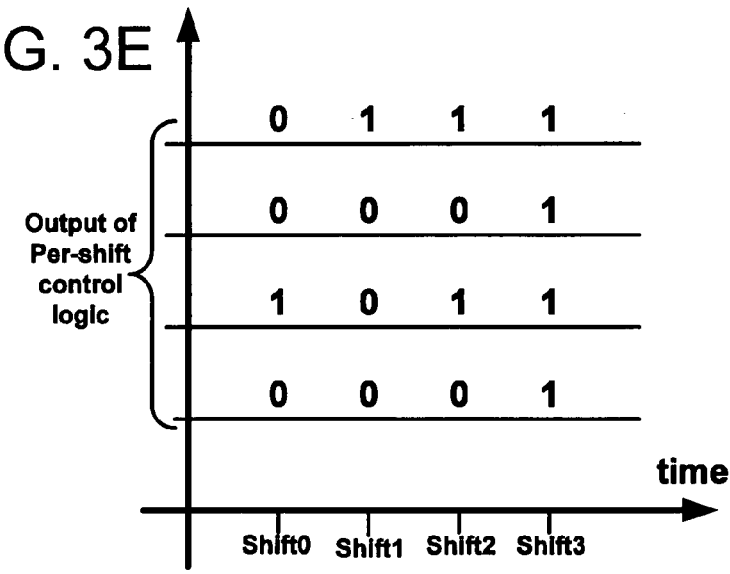
FIG. 3E illustrates, in a graph, values of control signals generated by the control logic 332 in the illustrative embodiment.
Figure 3F:
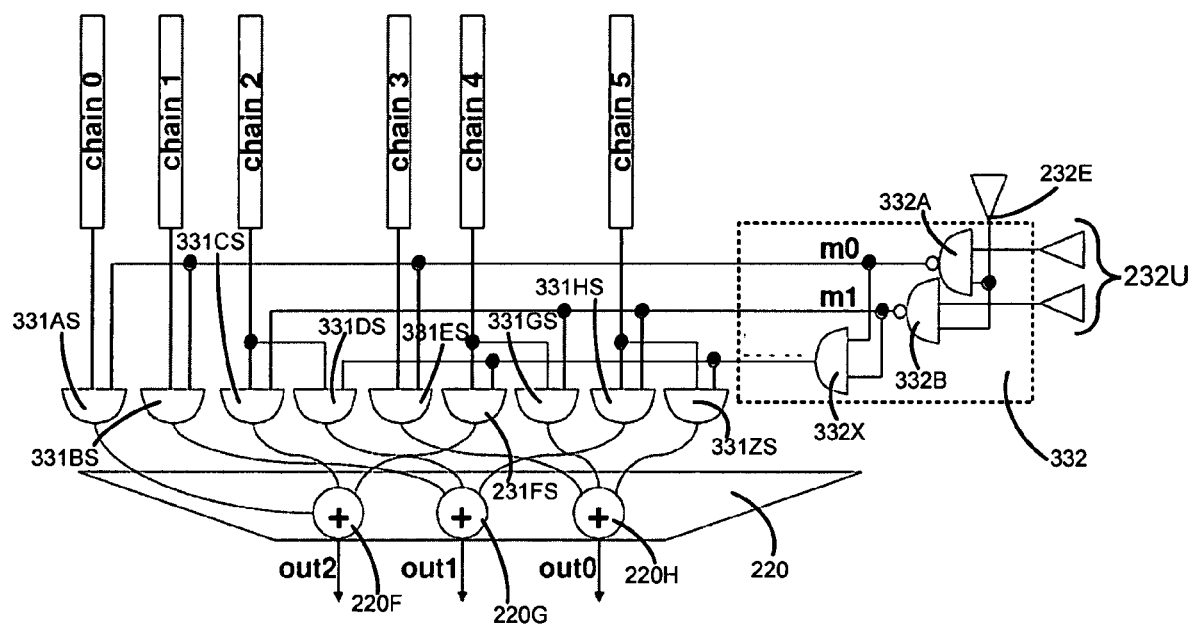
FIG. 3F illustrates AND gates used to implement a control logic for a selector of the type illustrated in FIGS. 3A-3D.

Control logic 332 can change the operation of selector 330 on a per-shift basis. Accordingly, the four modes shown in FIGS. 3A-3D can be implemented in successive shift cycles, as illustrated in FIG. 3E. The circuitry within control logic 332, which is required to generate the control signals to the observation logics 331A-331Z is also readily apparent, as illustrated in FIG. 3F. Specifically, several AND gates (in FIG. 3F, gates 332A and 332B) have their first input coupled to a corresponding control line 232U for unloading data and furthermore have their second input coupled to an enable line 232E. The outputs of control logic's AND gates (in FIG. 3F, gates 332A and 332B) are applied (via buffers) as inputs of AND gate 332X. Note that in the example shown, some scan chains are coupled to only one AND gate within the selector (e.g. AND gate 331AS), because an additional AND gate was not required. Note that the selector shown in FIG. 3F can be operated in the following modes.

| Mode | m0 value | m1 value | Enable value on control line 232E |
|---|---|---|---|
| Direct mode 0 | 0 | 1 | 1 |
| Direct mode 1 | 1 | 0 | 1 |
| Transparent mode | X | X | 0 |

Selector 230 is automatically designed in some embodiments of the invention, based on an existing compressor 220 which has been already designed, in the normal manner. Then, the direct observation modes of selector 230 are designed by a computer 150 (FIG. 9A) so that each scan chain 101J can be uniquely observed at an output of the compressor 220 in one of the direct observation modes, while keeping the total number of direct observation modes as small as possible. One embodiment of a method performed by computer 150 to design selector 230 is illustrated in FIG. 4A and described next.

Figure 4A:
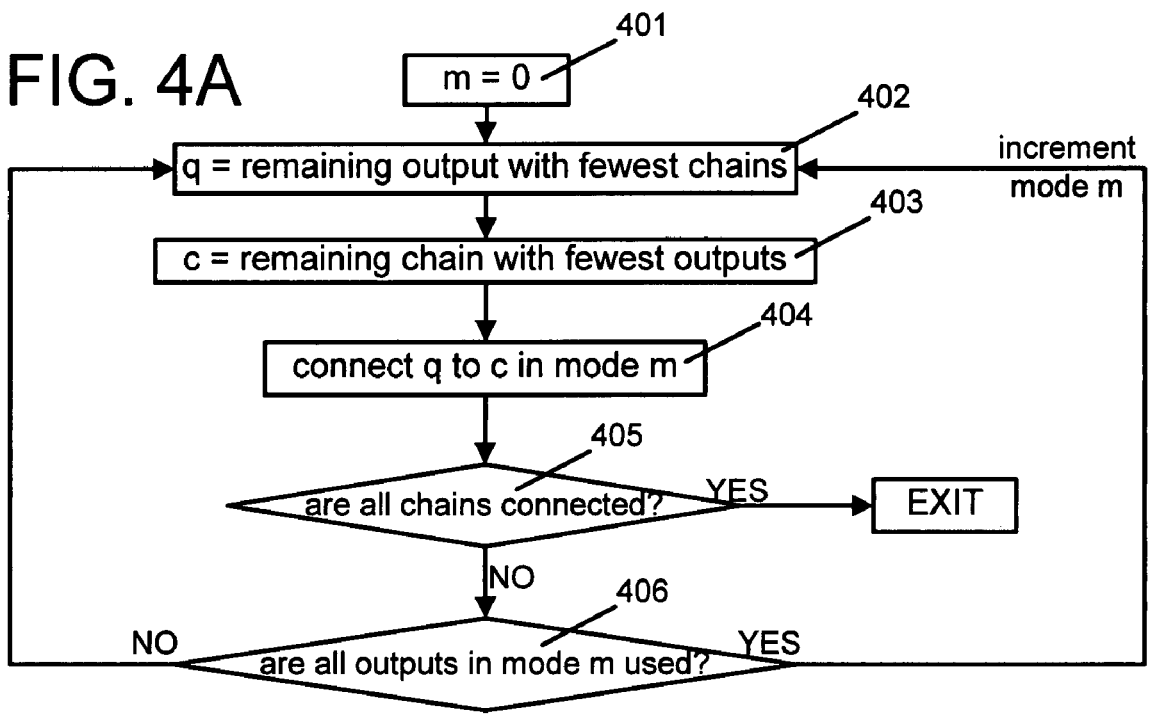
FIGS. 4A and 4B illustrate, in flow charts, two alternative embodiments of computer-implemented acts which are performed in some embodiments to design the selector of FIG. 3A.

Prior to performing the method of FIG. 4A, none of the outputs have been connected to any chain in a direct observation mode, and a variable denoting direct observation mode m is initialized to 0 in act 401. As shown therein, in a first act 402, the computer initializes a variable "q" to a remaining output with the fewest scan chains. As initially, none of the outputs is connected to any scan chain, q can be initialized to any output, and is typically initialized to the first output. In the next act 403, the computer initializes another variable "c" to a remaining chain with the fewest outputs. Once again, initially, none of the scan chains is connected to any output, and c can be initialized to any scan chain, and is typically initialized to the first scan chain 101A.

Note that acts 402 and 403 can be performed in any order relative to one another. Next, in act 404, the computer connects output q to scan chain c, in direct observation mode m. Thereafter, the computer checks in act 405 if all scan chains are connected in at least one of the direct observation modes. If the answer is yes, then the computer exits from performing this method, as the design of modes for scanner 230 has been completed. If the answer is no, then the computer goes to act 406 and checks if all outputs in direct observation mode m have been used up (i.e. connected to a scan chain). If the answer is yes, then the computer increments the mode m, and returns to act 402 to repeat the acts 402-406 with the new mode. If the answer is no, then the computer simply returns to act 401 to continue to perform the acts 402-406 in the current mode.

Figure 4B:
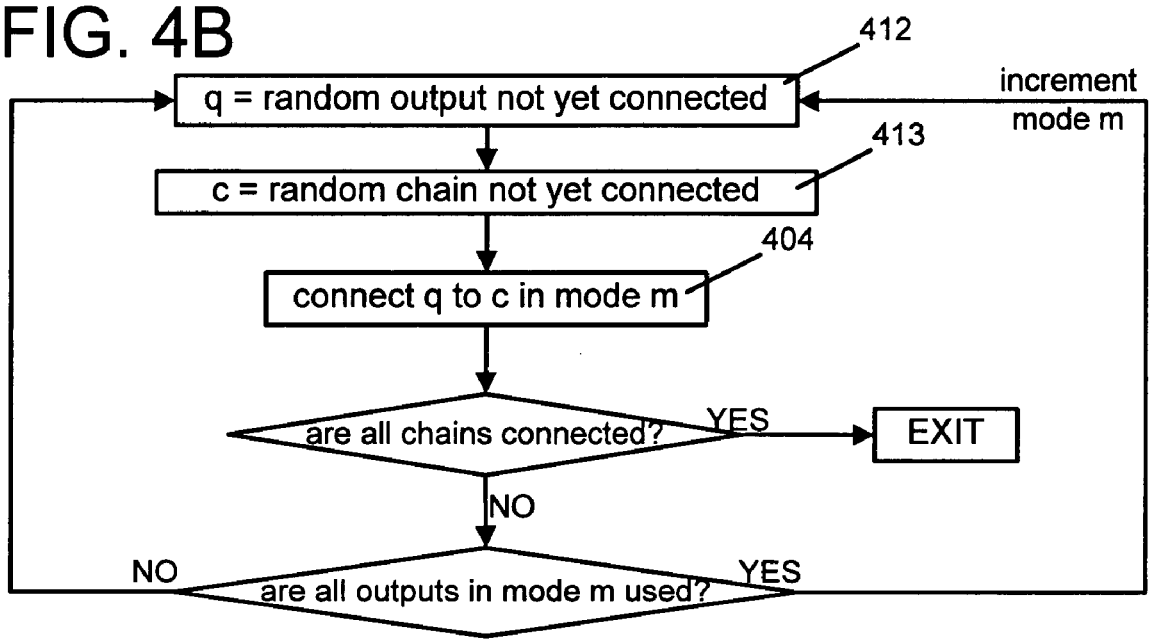

Instead of a greedy heuristic that has been illustrated in FIG. 4A and described above, other heuristics may be used in other embodiments in the design of direct observation modes to be used to operate selector 230. For example, some embodiments use a random heuristic, such as the one illustrated in FIG. 4B. The method of FIG. 4B is similar to the above-described method of FIG. 4A except that acts 402 and 403 are replaced by acts 412 and 413. In act 412, q is set to any random output that is not yet connected. And in act 413, c is set to any random chain that is not yet connected. Other such heuristics for the design of direct observation modes will be apparent to the skilled artisan in view of this disclosure.

Operation of selector 230 in one of the modes described above is controlled by per-shift control logic 232 (FIG. 2B) which receives signals presented on control lines 232U . . . 232E. A number of these control lines (e.g. E in number) are driven from signals at primary inputs, and such lines are identified as enable lines 232E while the remaining lines (e.g. U in number) are driven by signals from decompressor 210 (FIG. 2B). The U remaining lines are identified in FIG. 2B as unload control lines 232U. E and U can have any values, i.e. any number of enable lines and any number unload control lines can be used, depending on the embodiment. The total number of control lines E+U that are needed depends on the number of direct observation modes.

In some embodiments, E is 1 and only a single line 232E is connected to a primary input, and used to turn on/off the transparent mode of selector 230. In such embodiments, the number U is directly dependent on the number of direct observation modes. Note that selector 230 can be configured independently of the split between U and E (FIG. 2B).

Figure 5:
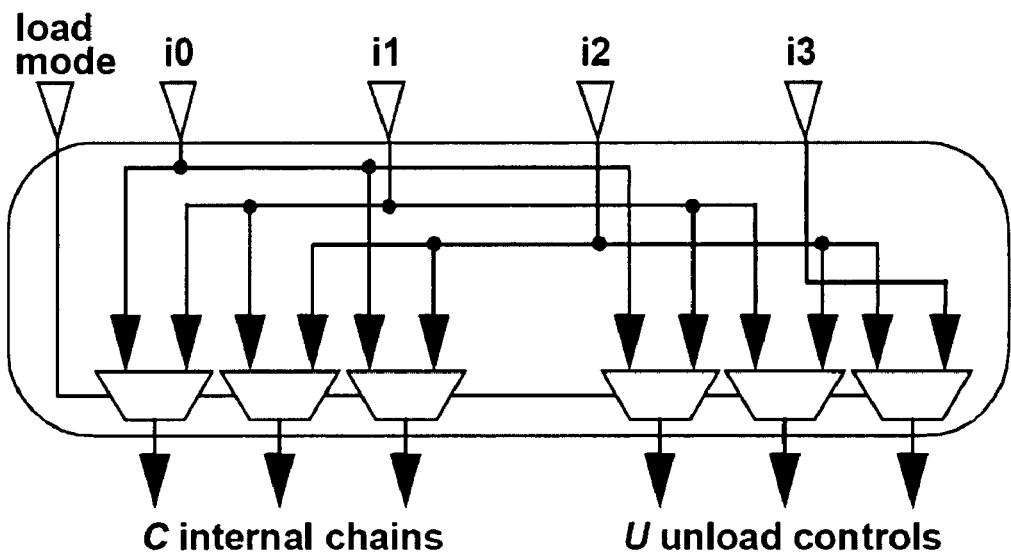
FIG. 5 illustrates an architecture of a decompressor to generate the control signals supplied to control logic 332 in some embodiments of the invention.

Some embodiments use a shared configuration for generating the U signals from combinational compressor 220 from the same primary inputs as the signals to be loaded into the scan chains (which are C in number) as illustrated in FIG. 5. In such embodiments, the load compressor 220 is first designed for C scan chains, so that any two chains can load independent values in at least one mode. Thereafter, the U unload controls are automatically designed to be independent to allow selection of any unload mode by ATPG software, by a computer 150 performing a method of the type described next.

Computer 150 of some embodiments uses a local-minimization heuristic to compute a cost function, based on the number of times primary inputs, and pairs of primary inputs are used. In the example illustrated in FIG. 5, computer 150 computes the number of times each of i0, i1, i2 and i3 are used, and also computes the number of times each pair (i0, i1), (i1, i2), (i2, i3), (i0,i2), (i0,i3), (i1,i3) etc is used. Specifically, computer 150 prepares a table 701 (FIG. 7) which has a row for each primary input, a column for usage, and additional columns for each input. The usage column indicates how many times the primary input for the current row has been used. Table 701 (also called "cost table") is initialized to 0 for all inputs and input pairs, except for diagonal entries which are initialized to a very large value (shown blank in FIG. 7) to avoid choosing the same primary input twice.

Figure 6A:
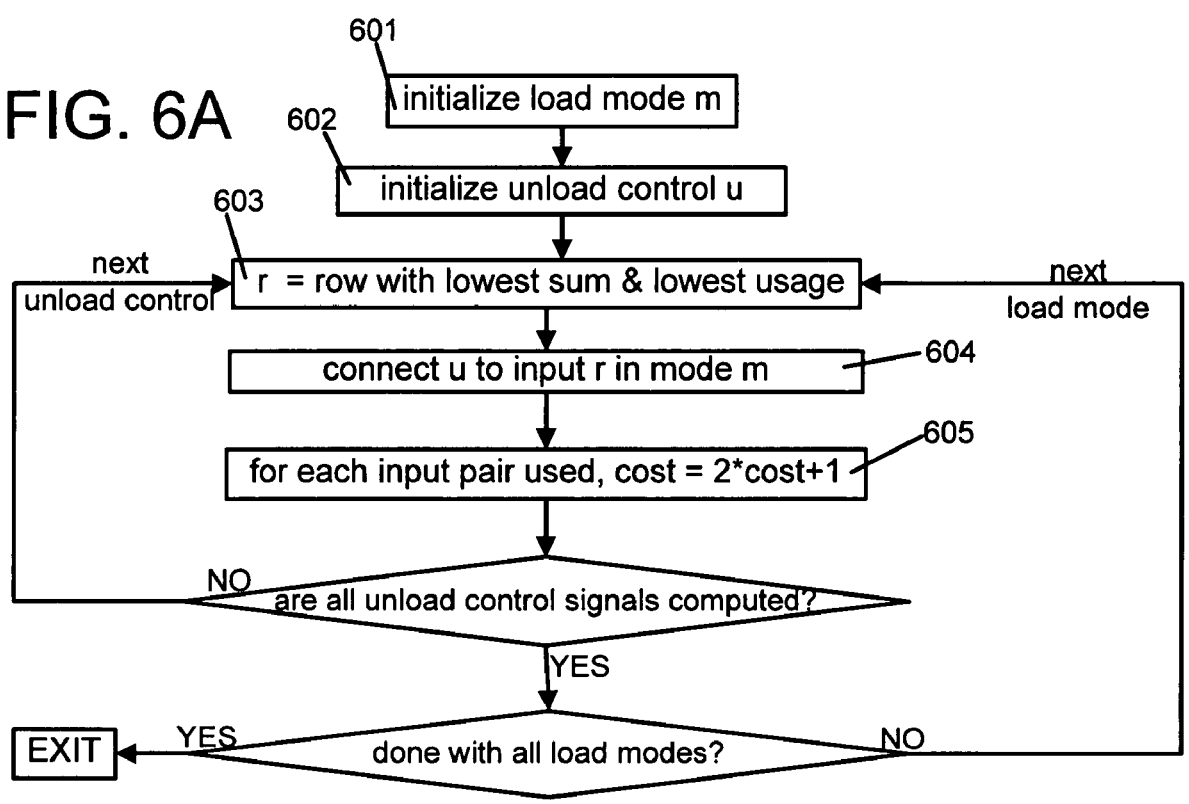
FIGS. 6A and 6B illustrate, in flow charts, two alternative embodiments of computer-implemented acts which are performed in some embodiments to design the decompressor of FIG. 5.

Thereafter, computer 150 performs the method shown in FIG. 6A as follows. In acts 601 and 602, computer 150 initializes the load mode m to 0 and the unload control u to 0. Next, in act 603, computer 150 selects r to be the row with the lowest sum over all pairs (r,n). In case of equal sums, the row with lower usage is chosen. In the first iteration, the row for primary input 0 is selected. Thereafter, in act 604, the computer 150 (FIG. 9A) connects unload control u to primary input r in load mode m. A results table 703 (FIG. 7) with a row for each unload control and a column for each mode is updated with the identity of the primary input r, at the end of act 604. Then in act 605, computer 150 repeatedly increases the cost function, for each input pair that has been used.

In the embodiment illustrated in FIG. 6A, the computer increases the cost by doubling it and adding 1, as follows: cost=2*cost+1. Note that in alternative embodiments, other functions may be used to increment cost (e.g. cost=2.1*cost+ 0.8). Thereafter, computer 150 checks if all unload control signals have been computed and if not returns to act 603 for the next unload control u. If all unload controls have been computed, the computer goes checks if all load modes have been visited and if not returns to act 603 for the next load mode. If all load modes have been visited, then the computer exits this table preparation method.

Figure 7:
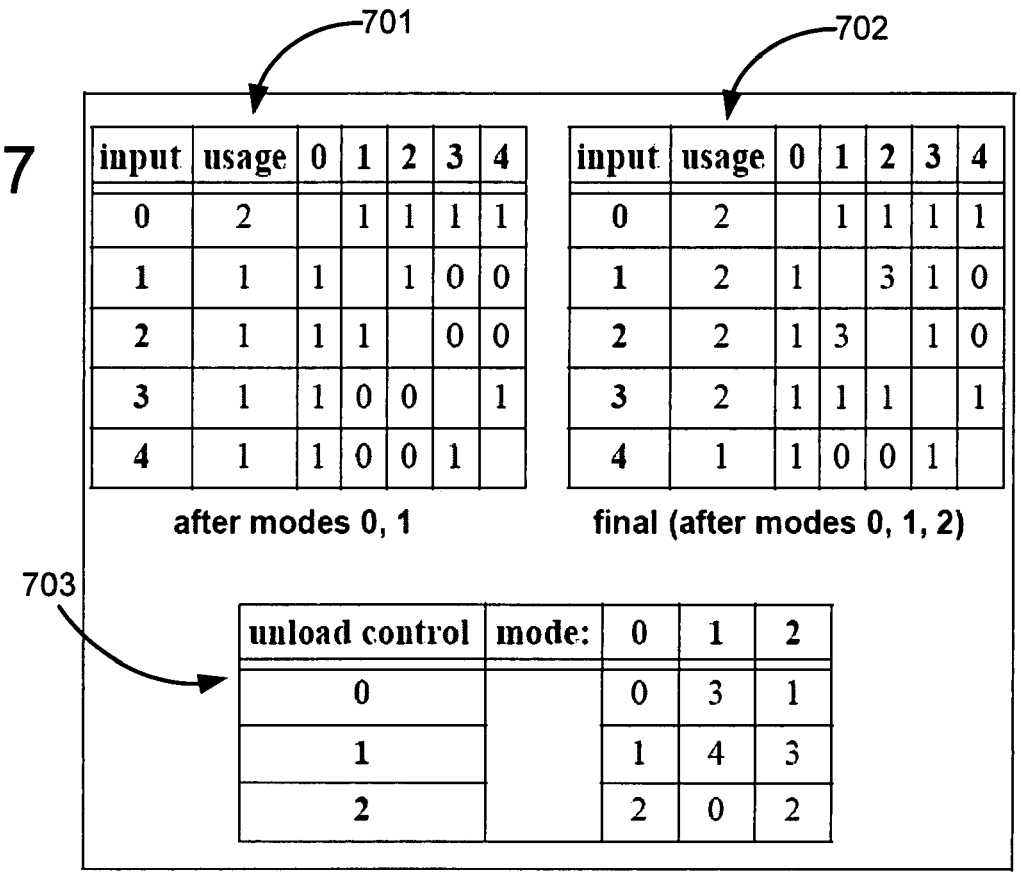
FIG. 7 illustrates in tables, unload control generation, specifically cost tables and final assignments.

To summarize, table 701 in FIG. 7 illustrates the cost table after modes 0 and 1 have been computed. At this stage, the usage value of 2 in the first row of table 701 indicates that primary input 0 has been used twice. Note that the sum for this first row is 4, at this stage. Table 702 in FIG. 7 illustrates the cost table after modes 0, 1 and 2 have been computed. Finally, Table 703 illustrates the final assignments of primary inputs to unload controls, which result from act 604 during performance of this method.

Figure 6B:
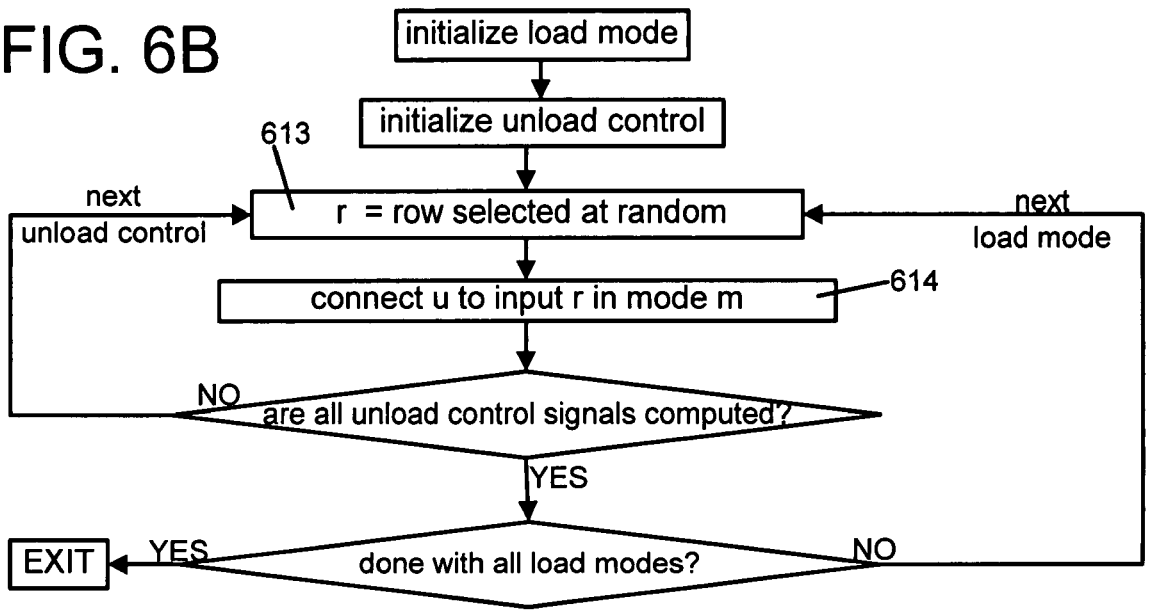

Instead of a local minimization heuristic, other heuristics may be used in other embodiments. For example, some embodiments use a random heuristic, such as the one illustrated in FIG. 6B. FIG. 6B's heuristic is similar to FIG. 6A's heuristic except that acts 603-605 are replaced by acts 613 and 614. In act 613, r is set to any random row. And in act 614, u is connected to input r in mode m.

A method of using selector 230 is illustrated in FIGS. 8A-8B, and described next. Specifically, in act 801 the computer selects a primary target fault. Next, in act 802 the computer checks if the selection act was successful, and if not exits. If yes, then the computer goes to act 803 and creates a test pattern for the selected fault using ATPG. Next, in act 804, the computer 150 (FIG. 9A) once again if the creation act was successful, and if not returns to act 801. If yes, then the computer goes to act 805 and checks if the primary target of the previous pattern has been detected in the multi-fanout overlap mode (i.e. transparent mode) of if the next pattern was rejected. If yes, then the computer goes to perform the acts shown in FIG. 8B and discussed below. If no, then the computer goes to act 806 and sets direct observation mode for primary target of previous pattern.

Next, in act 807 the computer checks if the setting act was successful, and if so goes to act 808 and if not goes to act 809. In act 808 the computer selects a direct observation mode (from among several for this selector), based on ability to observe as many secondary targets of previous pattern as possible, and then goes to perform the acts shown in FIG. 8B and discussed below. In act 809 the computer checks if the single fanout overlap mode detects the primary target of the previous pattern and if not goes to perform the acts shown in FIG. 8B. In act 809, if yes, then the computer sets the single fanout overlap mode (in act 810) and then performs the acts shown in FIG. 8B.

The method of FIG. 8A continues by performing the acts illustrated in FIG. 8B as follows. Specifically, in act 811 the computer selects a secondary target fault. Next, in act 812 the computer creates a test pattern for the selected fault using ATPG. Next, in act 813 the computer checks if the creation act was successful, and if yes then returns to act 811. If not successful, then the computer goes to act 88 and checks if the limit on the secondary target faults has been reached. If not, then the computer returns to act 811. If yes, then the computer goes to act 815 and fills in non-care bits (also called "don't care" bits) for the current pattern. Then in act 816 the computer performs simulation on various previous patterns (assuming no faults), and then goes to act 817, which is a looping condition.

Specifically, in act 817, the computer 150 (FIG. 9A) loops over each shift cycle in the multi-fanout overlap mode to perform the following acts. In act 818, the computer checks if the observability of the other two modes, direct mode or single fanout overlap mode, is higher. If yes, the computer 150 (FIG. 9A) goes to act 819 and sets the controls signals appropriately to switch mode. Then the computer goes to act 820, which is also reached from the no branch of act 818. Act 820 is a terminating condition of the for loop of act 817.

The EDA software design process (910) is actually composed of a number of stages 912-930 (FIG. 9B), shown in linear fashion for simplicity. In an actual ASIC design process, the particular design might have to go back through steps until certain tests are passed. Similarly, in any actual design process, these steps may occur in different orders and combinations. This description is therefore provided by way of context and general explanation rather than as a specific, or recommended, design flow for a particular ASIC. A brief description of the components of the EDA software design process (stage 910) will now be provided.

System design (stage 912): The circuit designers describe the functionality that they want to implement, they can perform what-if planning to refine functionality, check costs, etc. Hardware-software architecture partitioning can occur at this stage. Exemplary EDA software products from Synopsys, Inc. that can be used at this stage include Model Architect, Saber, System Studio, and DesignWare® products.

Logic design and functional verification (stage 914): At this stage, the VHDL or Verilog code for modules in the system is written and the design (which may be of mixed clock domains) is checked for functional accuracy. Exemplary EDA software products from Synopsys, Inc. that can be used at this stage include VCS, VERA, DesignWare®, Magellan, Formality, ESP and LEDA products.

Synthesis and design for test (stage 916): Here, the VHDL/Verilog is translated to a netlist. The netlist can be optimized for the target technology. Additionally, the design and implementation of tests to permit checking of the finished chip occurs. Exemplary EDA software products from Synopsys, Inc. that can be used at this stage include Design Compiler®, Physical Compiler, Test Compiler, Power Compiler, FPGA Compiler, Tetramax, and DesignWare® products. Note that retiming and resynthesis are part of the Design Compiler® product. Therefore, retiming and resynthesis are used in stage 916. Note that retiming is not limited to stage 916—i.e. it may occur in other stages, such as stage 922.

Figure 9A:
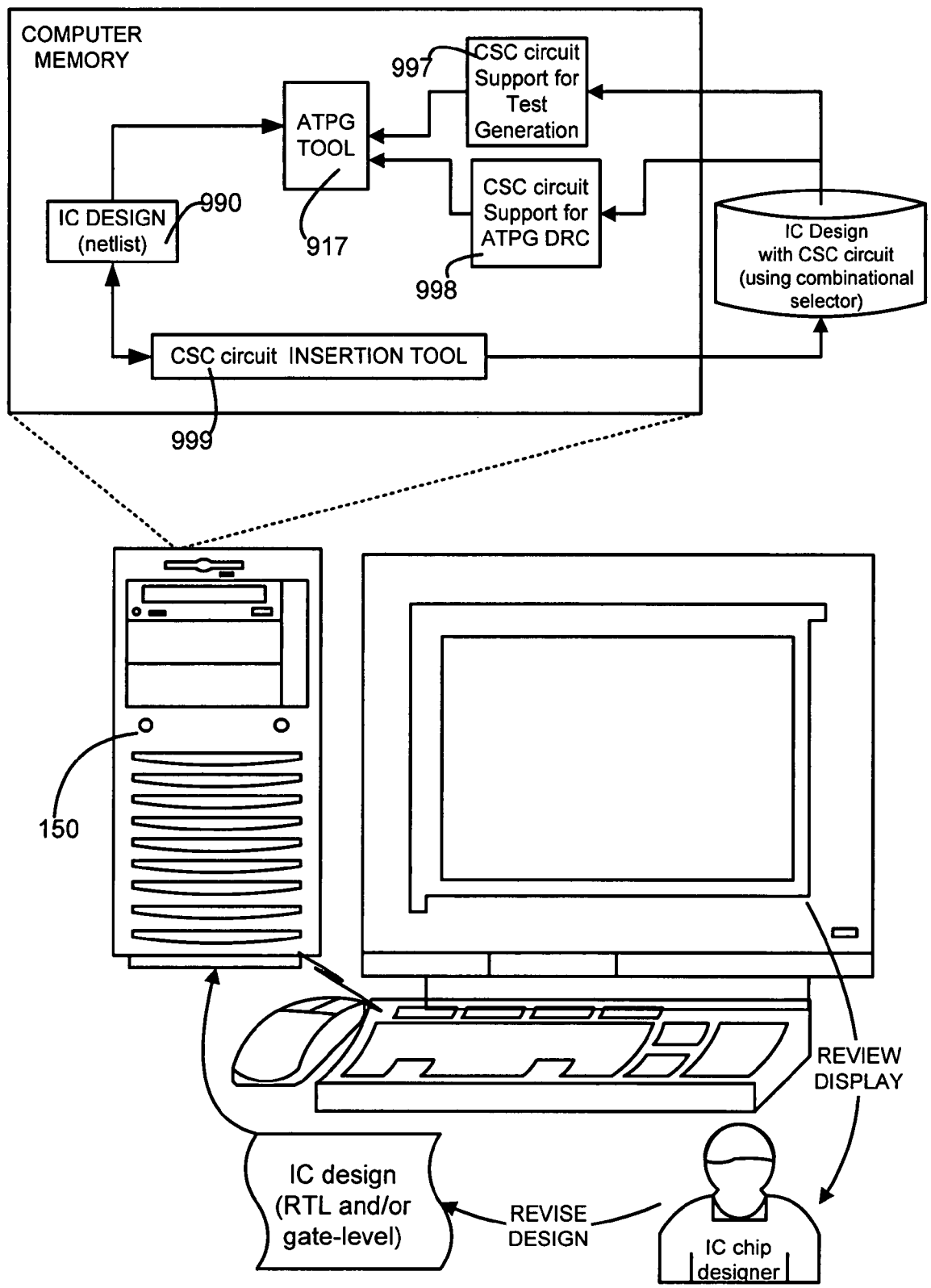
FIG. 9A illustrates, in a block diagram, a computer that is programmed to insert into an IC design, a combinational scan compression (CSC) circuit having a combinational selector in accordance with the invention.

Netlist verification (stage 920): At this step, the netlist is checked for compliance with timing constraints and for correspondence with the VHDL/Verilog source code. Exemplary EDA software products from Synopsys, Inc. that can be used at this stage include VCS, VERA, Formality and PrimeTime products. Note that a combinational scan compression circuit insertion tool 999 (of the type described above in reference to FIGS. 4A,4B,6A,6B) can be used during this stage 920, as shown in FIG. 9B. If the displayed results are not satisfactory, a chip designer may go back to stage 916 to make changes to the IC design as shown in FIG. 9A.

Note that netlist verification may also be performed at a later time, as stage 921 in the design flow shown in FIG. 9A, which is performed after physical implementation (stage 922). Hence, combinational scan compression circuit insertion tool 999 can also be used to compare original HDL to the netlist after physical implementation, if retiming occurred anywhere in the intermediate steps.

Design planning (stage 918): Here, an overall floorplan for the chip is constructed and analyzed for timing and top-level routing. Exemplary EDA software products from Synopsys, Inc. that can be used at this stage include Jupiter and Floorplan Compiler products.

Physical implementation (stage 922): The placement (positioning of circuit elements, such as the above-described sequential cells and combinational cells) and routing (connection of the same) occurs at this step. Exemplary EDA software products from Synopsys, Inc. that can be used at this stage include the Astro product. Although circuitry and portions thereof (such as rectangles) may be thought of at this stage as if they exist in the real world, it is to be understood that at this stage only a layout exists in a computer 150. Note that retiming may occur in stage 922.

As noted above, design flow shown in FIG. 9A includes another stage of netlist verification 921, after physical implementation. The actual circuitry in the real world is created after this stage, as discussed below.

Analysis and extraction (stage 924): At this step, the circuit function is verified at a transistor level, this in turn permits what-if refinement. Exemplary EDA software products from Synopsys, Inc. that can be used at this include Star RC/XT, Raphael, and Aurora products.

Physical verification (stage 926): At this stage various checking functions are performed to ensure correctness for: manufacturing, electrical issues, lithographic issues, and circuitry. Exemplary EDA software products from Synopsys, Inc. that can be used at this include the Hercules product.

Resolution enhancement (stage 928): This involves geometric manipulations of the layout to improve manufacturability of the design. Exemplary EDA software products from Synopsys, Inc. that can be used at this include iN-Phase, Proteus, and AFGen products.

Mask data preparation (stage 930): This provides the "tape-out" data for production of masks for lithographic use to produce finished chips. Exemplary EDA software products from Synopsys, Inc. that can be used at this include the CATS® family of products. Actual circuitry in the real world is created after this stage, in a wafer fabrication facility (also called "fab").

The data structures and software code for implementing one or more acts described in this detailed description can be encoded into any article of manufacture that includes a computer-readable storage medium. Depending on the embodiment, the computer-readable storage medium is any storage medium that can hold code and/or data for use by a computer. Storage medium includes, but is not limited to, magnetic and optical storage devices such as disk drives, magnetic tape, CDs (compact discs), and DVDs (digital versatile discs).

In one embodiment, a computer performs one or more steps in the methods illustrated in FIGS. 4A, 4B, 6A and 6B. In another embodiment, a computer uses an IC design in a file of the type illustrated in FIG. 9A, and a combinational scan compression circuit insertion tool of the type illustrated in FIG. 9B.

Note that a computer system used in some embodiments to implement a combinational scan compression circuit insertion tool of the type described herein uses one or more linux operating system workstations (based on IBM-compatible PCs) and/or unix operating systems workstations (e.g. SUN Ultrasparc, HP PA-RISC, or equivalent), each containing a 2 GHz CPU and 1 GB memory, that are interconnected via a local area network (Ethernet).

Fully X-tolerant Architecture

Figure 1A:
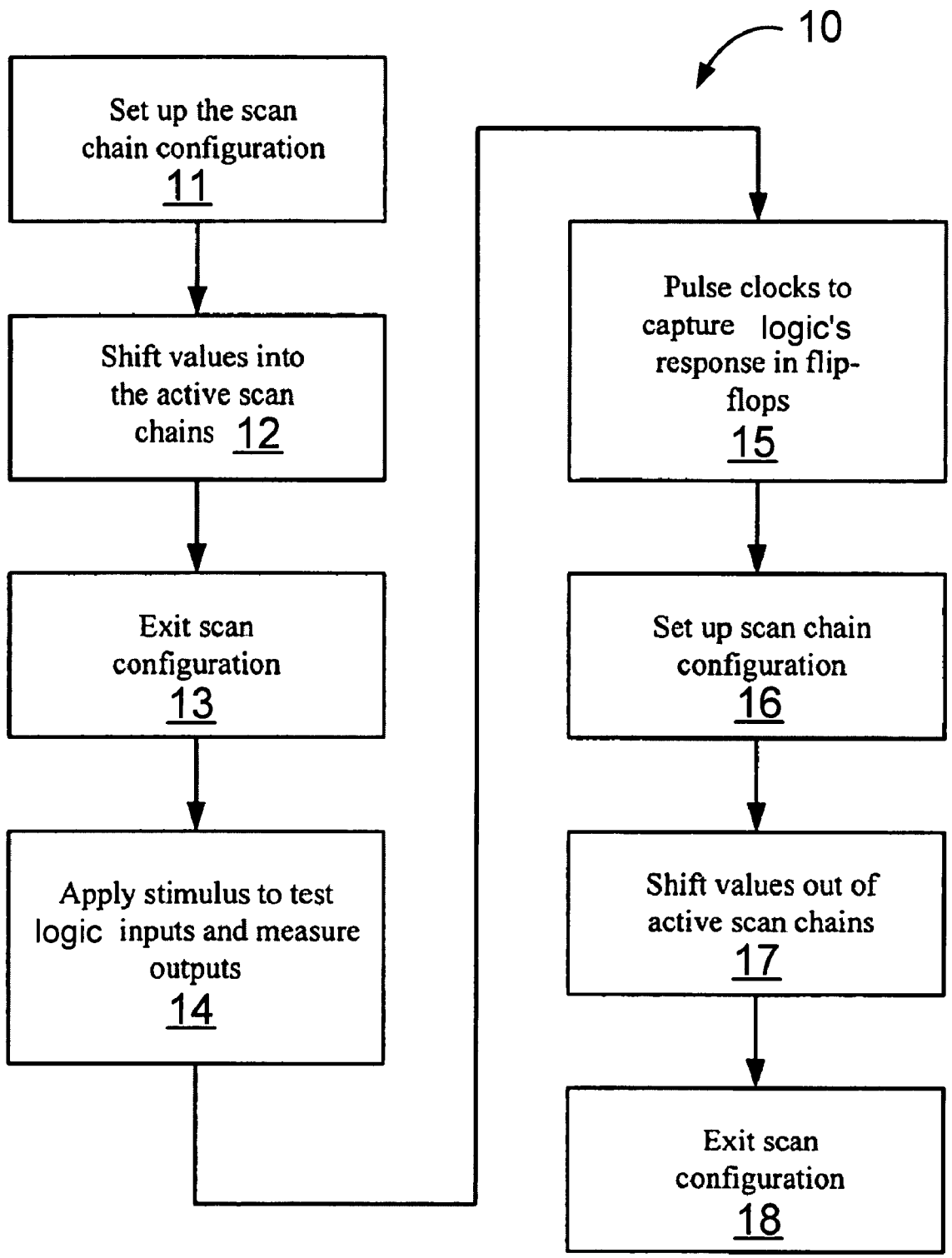
FIG. 1A illustrates a prior art flow for processing a scan test pattern.
Figure 1B:
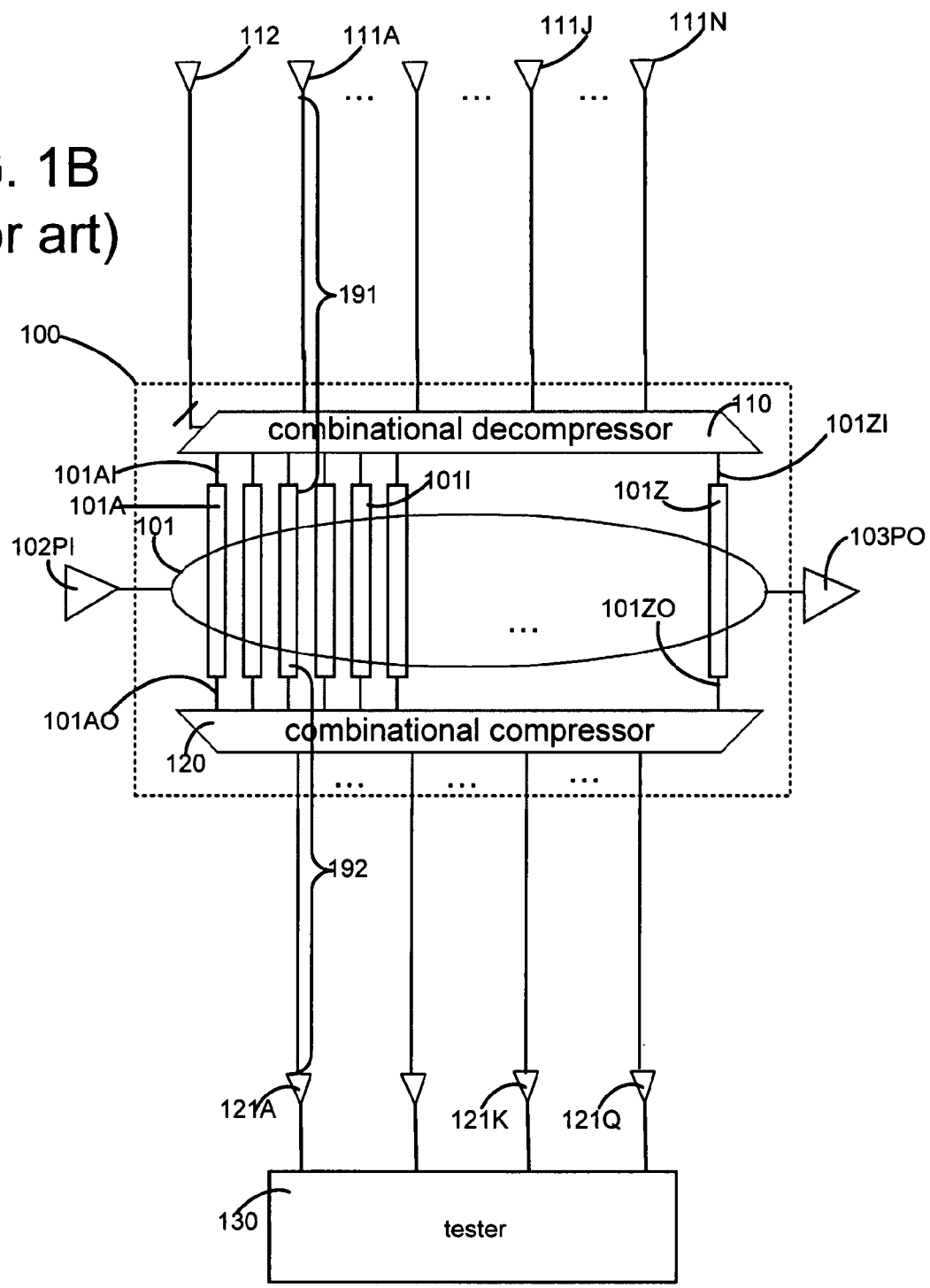
FIG. 1B illustrates an electronic device of the prior art, including a CSC circuit 100.
Figure 1C:
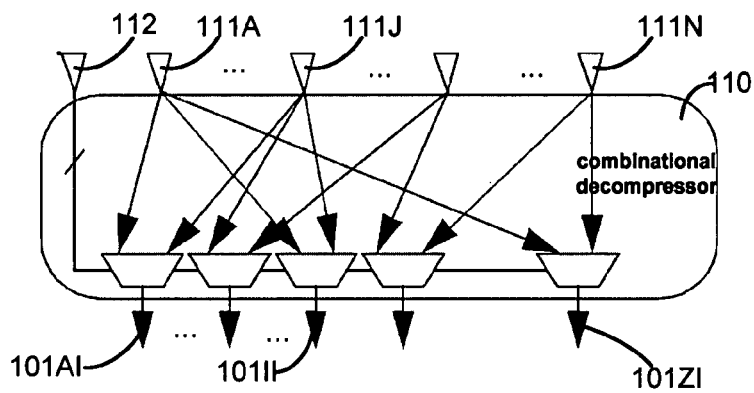
FIGS. 1C-1E illustrate prior art components within the electronic device of FIG. 1B.
Figure 1D:
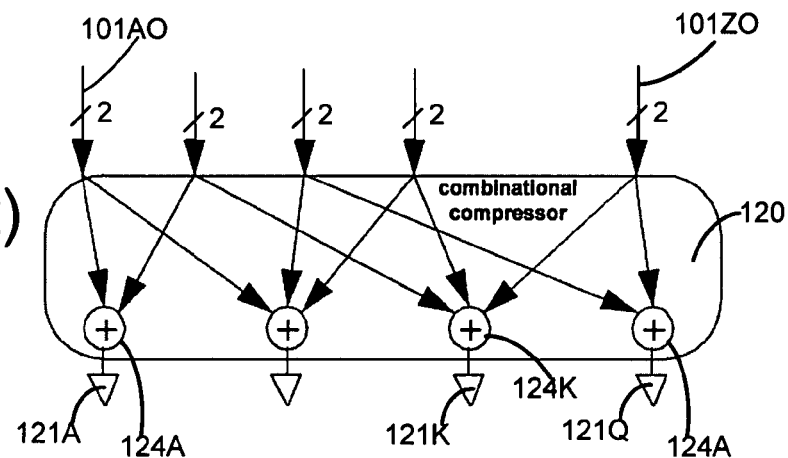
Figure 1E:
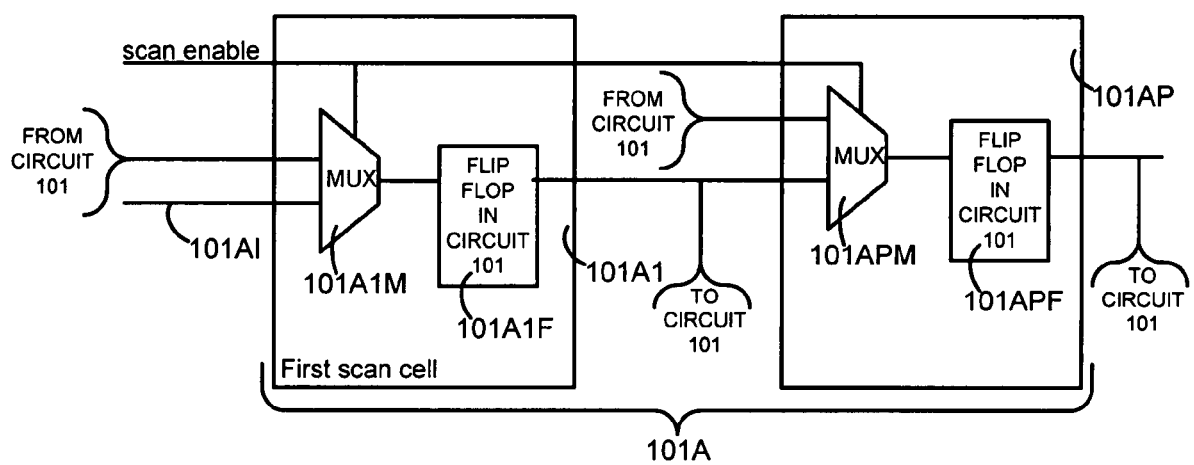

The architecture presented in FIG. 1B is extended in accordance with the invention by adding a selector (also called "unload selector") between the outputs of the internal scan chains and the inputs of the unload compressor (FIG. 2A). As before, circuitry is added only on the inputs and outputs of scan chains, and only combinational gates are added, maintaining a simple scan flow. In fact, the unload selector can be implemented with only a few AND gates. For most shift cycles, the unload selector functions transparently; it simply passes through unload values with no change, so that the architecture in FIG. 2A functions exactly as the one in FIG. 1B. This is sufficient for shift cycles where the unknown values, if any, do not mask any desired observability.

However, when needed, a group of exactly Q scan chains are selected for direct one-to-one observation at the Q outputs. In direct observation mode, the unload selector functions as a filter so that the unload compressor does not XOR together any of the unload values, thus 100% X-tolerance is guaranteed. Enough direct observation modes are provided so that every chain is directly connected to an output in at least one mode, therefore the architecture ensures no X-masking of the scan cell targeted for fault observation, no matter how many Xs are in other scan cells. To minimize pattern count, multiple faults must be observable during every unload. Consequently, to ensure every shift can observe targeted scan cells, the unload selector can choose a different group of Q chains every shift or, to maximize observability, it can choose to function transparently.

Lastly, all Q scan chains can be observed in a singlefanout XOR mode, obtained when the unload selector gates off all but one fanout of each chain to the XOR inputs of the unload compressor. In certain circumstances, observability can be higher in single-fanout XOR mode than in the multiple-fanout XOR mode obtained when the unload selector functions transparently; and higher observability can reduce pattern count and improve detection of unmodeled defects. The unload selector is controlled by U unload control signals obtained from the load decompressor, and by E unload enable primary inputs. The exact values of U and E define a range of architectures: In the simplest implementation U=0, i.e., the unload selector is controlled every cycle by E dedicated unload enable inputs; the E values for every shift cycle are calculated during ATPG and stored as part of regular scan-in data. Because unload control data is not shared with load data, this implementation is termed "NON-SHARED". Based on the control inputs, the unload selector chooses between transparent (full XOR) mode or one of the direct observation modes.

Since at most Q chains can be observed in a direct observation mode, the minimal value for E is:

$$E = \left\lceil \log\left(1 + \left\lceil \frac{C}{Q} \right\rceil\right) \right\rceil$$

where the added 1 is for the transparent mode. For example, to achieve a compression of 10× (vs. scan), assuming there are 20% more compressed patterns than scan patterns, C=10*1.2*Q and E=4 unload inputs.

However, given a limited total input pin budget N+E, it is generally preferred to minimize E, so N can be maximized, thereby reducing care bit dependencies in the load compressor. Also, for cycles that do not require one of the direct observation modes, all inputs can then be dedicated to load care bits. The preferred implementation detailed in this paper uses E=1 unload enable inputs. In this case, the unload selector chooses one of the direct observation modes based on the U unload controls derived from the load decompressor, thus this implementation is termed "SHARED", and:

$$U = \left\lceil \log\left(\left\lceil \frac{C}{Q} \right\rceil\right) \right\rceil$$

The transparent mode is selected when the enable input is asserted, independent of the values on the U control signals. Note the potential conflicts on assigning values on the N scan input pins so that the care bits (load values) for pattern n+1 are satisfied simultaneously with the unload requirements on the U control signals for pattern n. Fortunately, most shift cycles use the unload selector in transparent mode, thus the U control signals can have any values and only the enable input must be asserted.

Finally, the architecture of FIG. 2A also supports optional pipelining of the N+E inputs and Q outputs (not shown), so that the delay of the combinational compressor/decompressor structures and added wires need not slow down the shifting speed. Pipestages, however, add additional complexity to overlapping a pattern load with the previous pattern unload.

Unload Selector Implementation

The unload selector must be designed to operate with the unload compressor, so that each chain can be uniquely observed (i.e., with no XOR-ing) in at least one direct observation mode. Also, the number of direct observation modes should be minimized, therefore minimizing the number of unload control signals U+E.

The unload selector can be implemented with no more than two AND gates per internal chain (FIG. 3A); for each chain, the first AND gates one of the paths from the chain output to an output pin, and the second AND gates the remaining fanout of the chain, if any (chains with single fanout need only a single AND). For example (FIG. 3A), chain c1 connects, via the XOR unload compressor, to outputs out1, out2 and out3; a first AND on the output of chain c1 gates its connection to out1, and a second AND gates its connection to out2 and out3. Similarly, c2 connects to out1, out2 and out4, etc.

In transparent mode, all four signals from the "unload control logic" to the AND gates are 1, so AND gates are "on", passing through the unload values. In the selective (direct observation) mode shown, the four signals from the unload control logic are (top-down) {0, 0, 1, 0}, respectively, and only the two shaded AND gates are on. Therefore, chain c1 is uniquely connected to out1, and c2 to out2 (some other chains, not shown, uniquely connect to out3 and out4). In the mode shown, chain c13 is not observed at any output: both of its AND gates are off. Similarly, if the four signals from the unload control logic are {1, 0, 0, 0}, chain c13 is observed at out1, while c1 and c2 are not observed.

The unload control logic consists of a simple combinational decoder of its U+E inputs. The unload selector plus the unload control logic add about two 2-input gates to each scan chain, bringing the total area overhead, including load decompressor and unload compressor, to about 12 gates per chain, a small fraction of the total chip area. The unload selector is designed after the unload compressor has been designed for optimal observability in the presence of unknown values. It is important to first optimize the unload compressor because transparent mode is typically the preferred mode due to its higher observability than direct observation modes, as long as the Xs do not prevent detection of targeted faults. The unload selector is then designed based on the existing unload compressor, so that each chain can be uniquely observed in some mode, and the total number of direct observation modes is as small as possible.

For example, in the following Table, ten chains (0, 1, ..., 9) are connected to 4 outputs (0, 1, 2, 3) so that in transparent mode (mode 0) chains 0, 2, 5, 7 and 8 are XOR-ed to output 0, chains 0, 3, 6, 7 and 9 are XOR-ed to output 1, etc.

TABLE

Non-optimal unload selector

| output | mode 0 | mode 1 | mode 2 | mode 3 | mode 4 |
|---|---|---|---|---|---|
| 0 | 0 2 5 7 8 | 0 | 5 | 2 | |
| 1 | 0 3 6 7 9 | 6 | 3 | | |
| 2 | 0 4 6 8 9 | 4 | | | |
| 3 | 1 5 7 8 9 | 7 | 8 | 9 | 1 |

To exploit the minimal hardware implementation (FIG. 3A), each direct observation mode (mode 1, 2, etc.) must select, for each output, one of the chains already connected to the output in mode 0. Ideally, each direct observation mode selects 4 unique chains so 10/4=2.5, i.e. 3 modes should suffice to observe all chains.

However, a careless assignment of chains to outputs for direct observation modes can result in more, e.g. 4 modes. Indeed (in table shown above), let chains 0, 5 and 2 be selected in modes 1, 2 and 3, respectively, for output 0, and chains 7, 8 and 9 be selected in modes 1, 2 and 3, respectively, for output 3. Next, for output 1, chains 6 and 3 can be selected for modes 1 and 2, but no new chain can be chosen for mode 2, because all other chains of output 1 (0, 7, 9) have already been assigned to some other output in some mode. Similarly, output 2 can only add chain 4. A fourth mode is needed to observe chain 1.

In some cases, the unload compressor may be such that C chains cannot be directly and uniquely observed at Q outputs in only $$\begin{bmatrix} C \\ Q \end{bmatrix}$$

modes; moreover, an algorithm that would guarantee the minimal number of modes for any unload compressor could be prohibitively slow. Instead, we devised a greedy heuristic that produced optimal results in all cases tried, with negligible run-time is shown below (and illustrated in FIG. 4A).

```
foreach direct-observation unload mode m
    repeat until all chains connected
        q=remaining output with fewest chains c=remaining
        chain with fewest outputs
        connect q to c in mode m
    end
end
```

For the previous example, the greedy heuristic shown above assigns first chains 2, 3, 4, 1 to outputs 0, 1, 2, 3 in mode 1 (see following table); next, chains 5, 7, 6, 0 are assigned to outputs 0, 3, 1, 2 (in this order) in mode 2; finally, chains 8 and 9 are assigned to outputs 0 and 1 in mode 3. Only 3 modes suffice to directly observe all chains. If two signals are used to decode the 3 modes, the last, unused 4th mode can be configured as the single-fanout XOR mode.

| output | mode 0 | mode 1 | mode 2 | mode 3 |
|---|---|---|---|---|
| 0 | 0 2 5 7 8 | 2 | 5 | 8 |
| 1 | 0 3 6 7 9 | 3 | 6 | 9 |
| 2 | 0 4 6 8 9 | 4 | 0 | |
| 3 | 1 5 7 8 9 | 1 | 7 | |

Shared Unload Control Implementation

The unload selector is configured independently of the split between U and E (FIG. 2A); the unload control logic decodes the U+E inputs into all required modes (FIG. 3A). However, when using the shared configuration, the U signals from the load compressor must be independent. The load compressor is first designed for C scan chains, so that any two chains can load independent values in at least one mode. The requirements for the U unload controls are stricter: all U signals must be independent to allow selection of any unload mode; fortunately, U is typically much smaller than C (2).

Further, to minimize the chance of conflict between load compressor inputs for satisfying care bits and for setting the U unload controls, there should be minimal overlap between load modes in how unload controls are assigned load compressor inputs. For example, (FIG. 5) the three internal chains receive inputs (i0, i1, i0) in load mode 0, and (i1, i2, i2) in load mode 1; any two chains can load independent values in at least one load mode, but not all three chains are independent: the values (0, 0, 1) cannot be loaded in either mode. By contrast, the three unload controls are independent in both modes: they receive inputs (i0, i1, i2) in load mode 0 and (i1, i2, i3) in load mode 1.

The METHOD devised for computing the unload controls is local-minimization heuristic as shown below and illustrated in FIG. 6A; the cost function is computed based on how many times inputs and pairs of inputs are used. A cost table is kept, initialized to 0 for all inputs and input pairs, except for the diagonal entries which are initialized to a very large value to avoid choosing the same input twice. At each step, the row r is chosen that has the lowest sum over all pairs (r, n); in case of equal sums, the row with lower usage is chosen.

METHOD for Unload control generation (local-minimization heuristic)

```
foreach load mode m
    foreach unload control.signal u
        r=row with lowest sum & lowest usage
        connect u to input r in mode m
        foreach input pair used
```

-continued

| METHOD for Unload control generation (local-minimization heuristic) |
|---|
| cost = 2*cost + 1<br>    end<br>  end<br>end |

For example, (FIG. 7) U=3 unload controls are assigned inputs from 0 to 4 for three load modes. For load mode 0, unload controls (0, 1, 2) are assigned inputs (0, 1, 2) respectively. Next, for load mode 1, the algorithm continues to assign unused input pairs, so unload controls (0, 1, 2) are assigned inputs (3, 4, 0) respectively (FIG. 7 bottom). The cost table at this stage is shown on the upper left of FIG. 7: input 0 was used twice, all other inputs were used once; all input pairs were used once, except pairs (1, 3), (1, 4), (2, 3) and (2, 4) have not been used yet. Finally, for load mode 2, unload controls (0, 1, 2) are assigned inputs (1, 3, 2) respectively; the final cost table is shown on the upper right.

When computing unload controls (as per the Unload control generation METHOD shown above and in FIG. 6A), it is desirable, but not required, that all unload modes be controllable in every load mode; for example, with 2 load modes and 4 load compressor scan inputs, 32 unload modes can be controlled, 16 in each load mode. In general, for N inputs (load mode controls+load compressor scan inputs), $2^N$ unload modes can be controlled, so up to $Q2^N$ internal chains can be observed with 100% X-tolerance. Therefore, for an implementation with the same number of inputs and outputs N=Q−1, fully X-tolerant compression is limited by the ratio of internal to external chains $2^{Q-1}$.

Single-fanout Full-observability XOR Mode

Figure 10:
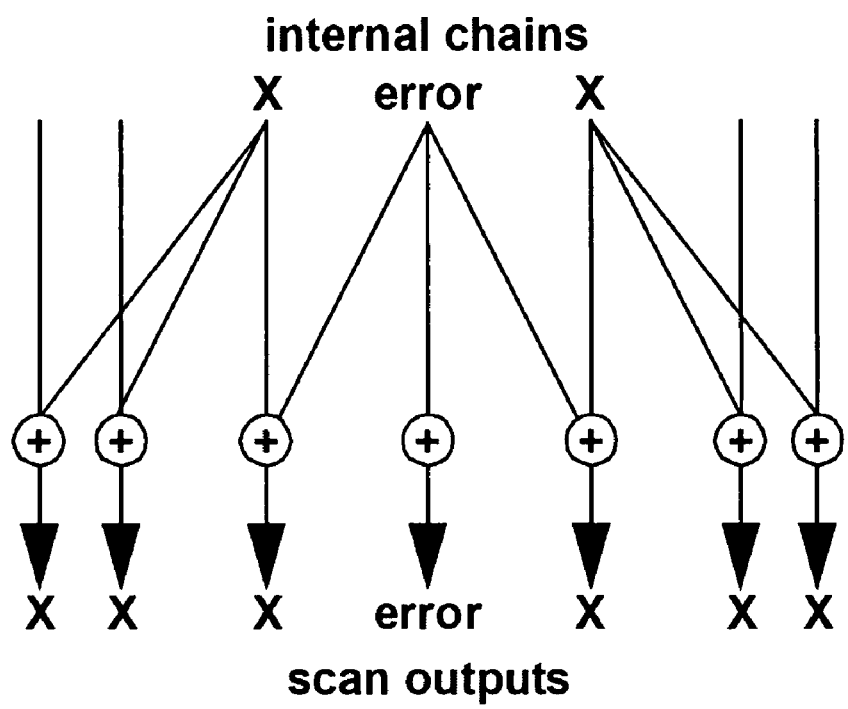
FIG. 10 illustrates in a graph, detection of one error in the presence of two Xs in some embodiments of the invention.

Unknown values render all outputs they propagate to unusable for the current cycle, thus may mask errors from being detected. Therefore, X-masking can reduce test coverage and, by reducing the number of faults detected per pattern, can increase pattern count. To guarantee detection of one error in the presence of two Xs, each chain must connect to at least 3 outputs so that any two chains share at most one output (FIG. 10).

However, increased chain fanout, while it can increase tolerance to one and two Xs per shift, can also decrease observability for more Xs, because each X masks out more outputs. For example, two simultaneous Xs can mask as many as 6 outputs, whereas in a compressor with chain fanout=1, two Xs can mask at most 2 outputs. Results of random simulation of compactors with chain fanout 1, 2 and 3 confirm this observation. For 192 chains and 16 outputs, compactors were generated with maximal X-tolerance for a given fanout, based on optimized algorithms. For 1, 2, 3, etc. randomly-placed Xs, the observability of the remaining, non-X chains was computed and averaged for 1000 trials. The results show that observability is highest for fanout=3 for up to 3 Xs per shift, then highest for fanout=2 for 4 to 7 Xs per shift; for 8 or more Xs, observability is highest for fanout=1. In fact, the single-fanout compactor still offers meaningful observability at higher densities of Xs, long after the multiple-fanout compactors have bottomed out at zero observability.

Even though direct-observation modes ensure detection of targeted faults no matter how many Xs are present, recent designs with high X densities can require so many shift cycles to use direct-observation modes that overall observability is low, increasing pattern count and lowering unmodeled defects detection. Therefore, the unload control logic (FIG. 3A) can also provide a single-fanout, full-observability XOR mode. To avoid changes to the unload selector, the new mode implements an overlap (XOR) of all direct-observation modes, so no gates are added to the unload selector. The changes to the unload control logic are trivial, so the total area is not affected. In effect, all single-fanout (shaded) AND gates (FIG. 3A) are on, while all other AND gates are off. The unload enable input selects between transparent and non-transparent modes; the latter can be either direct-observation modes, or the single-fanout XOR mode, as chosen by the unload controls.

DRC & ATPG Enhancements

Design Rules Checking was enhanced with new rules that validate the X-masking logic in the design versus its description in the test protocol file. These can be grouped into: •Syntax checking for the new constructs. •Consistency checking of the structures as defined in the protocol file, and verification of the connectivity between ports and the compressor/decompressor logic, between the compressor/decompressor logic and the internal scan chains, and between the compressor/decompressor logic and the X-masking logic. •Data consistency checks to ensure that the X-masking logic does indeed provide 100% X-tolerance.

For enhanced performance, the ATPG process then uses the behavioral descriptions of the compressor/decompressor logic, derived from the protocol, rather than the gate-level netlist. The architecture described, although deceivingly simple, provides particular challenges for ATPG, as detailed in the rest of this section.

Figure 11:
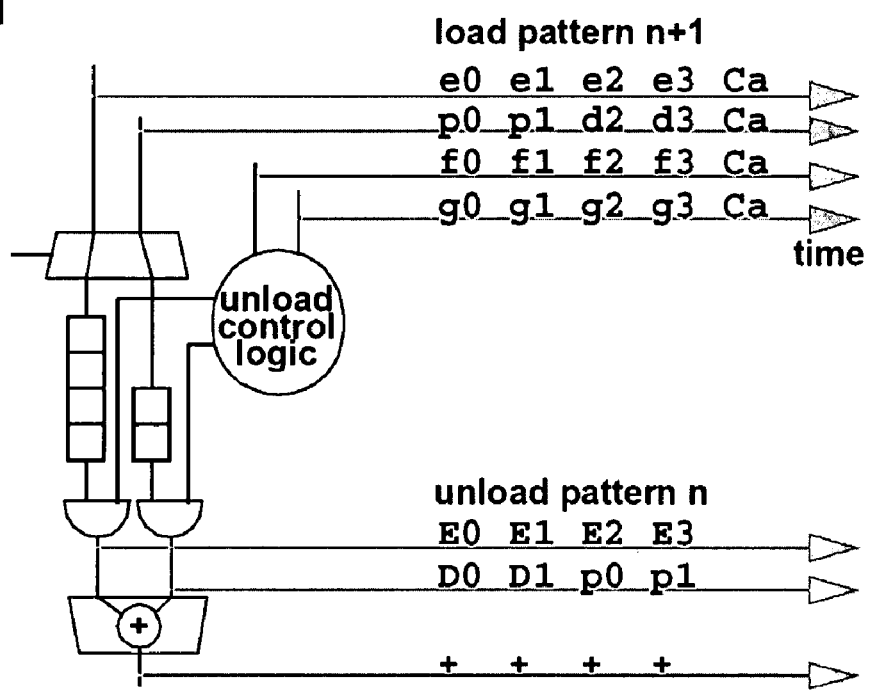
FIG. 11 illustrates, in a block diagram, various load and unload patterns in certain embodiments of the invention.

In regular scan, each pattern can be independently computed; then, when writing out patterns in a tester-ready format, the load of pattern n+1 is simply overlapped with the unload of pattern n—no further pattern adjustment is needed. With compression (FIG. 1B), unload values of pattern n have a dependency on the overlapped load values of pattern n+1, due to short chains whose captured scan cell values cannot contribute to all the shifts. Consider two chains "e" and "d" of lengths 4 and 2, respectively (FIG. 11). The first unload values of pattern n is the XOR of the captured values E0 and D0, respectively.

Similarly, the second shift cycle unloads the XOR of captured values E1 and D1. However, the third and fourth shift unload padding values p0 and p1 from the shorter "d" chain; these values have been shifted in during the overlapped load of pattern n+1, and are XORed with captured values E2 and E3. Therefore, to observe E2 and E3, it is necessary to consider the load values p0 and p1 of pattern n+1 when determining the unload values of pattern n. ATPG can still generate each pattern independently, but the final unload values observed at the output of the unload compressor cannot be computed until the next pattern has been created. Also, an additional pattern must be added to the end of the pattern set to define the load values being used for the last unload.

The unload selector (FIG. 2A) adds an additional dependency between adjacent patterns: the values unloaded for pattern n depend on the inputs to the combinational unload control logic, f0, f1, . . . and g0, g1, . . . (FIG. 11) simultaneously loaded during pattern n+1. Further, in the shared architecture, f and g are part of the U unload controls obtained from the load decompressor, so a dependency exists between (e0, p0, f0, g0), between (e1, p1, f1, g1), (e2, d2, f2, g2) etc. ATPG must consider these dependencies, so patterns can no longer be computed independently. Paradoxically, pattern n cannot be completed until a future pattern, n+1, is computed.

Finally, if pipelining is added to the N scan inputs and/or Q scan outputs of FIG. 2A, the dependencies between adjacent patterns shift accordingly, so the unload values of a pattern can depend on some load values of the next as well as some load values of the same pattern. ATPG must compute each pattern considering load-unload dependencies, as well as dependencies to future patterns.

An experimental analysis of load and unload dependencies is studied, where each data point is the average of 1000 random trials on a 200 chains design, with 16 total inputs. The non-shared X-tolerance architecture was configured with 3 load modes (2 load mode inputs), 10 scan inputs and 4 unload inputs—"load/load (not shared)"; the load decompressor ensures, by design, zero conflicts for up to two care bits, but conflict probability is higher than 0 for 3 or more care bits.

The shared X-tolerance architecture was also configured with 3 load modes (2 load mode inputs), but with 13 scan inputs and 1 unload enable input. By comparison, the "load/load (shared)" conflicts are significantly lower, due to the available extra 3 scan inputs. However, the shared architecture adds load/unload conflicts, i.e., the probability of not being able to set a desired direct-observation mode in a shift that already must satisfy a number of care bits. However, care bits are more often needed than nontransparent unload selector modes, so lowering load/load conflicts can be advantageous, even if load/unload conflicts are added. For optimal creation of patterns, the ATPG process must carefully consider these effects of X-tolerant operation.

ATPG for Shared Architecture

For circuits with shared X-tolerance, the control of the X-tolerance selection is shared with the scan chain loading of the next pattern. This results in a complex dependency between adjacent patterns which cannot be ignored during test generation if direct-observation modes are to be used without the insertion of dummy patterns. Test generation first creates a pattern that is intended to detect a primary target fault. Before secondary target faults are considered, any care bits which can be used to provide needed direct-observation modes for faults detected in the previous pattern are set if possible. If the direct-observation mode needed for a targeted fault cannot be satisfied, an attempt is made to set one of the single-fanout XOR modes if it results in fault detection. Secondary fault test generation is then performed to complete the pattern creation. After non-care bits have been filled in, good-machine simulation is performed on this pattern using the direct-observation modes created for the next pattern.

For shifts with the observe selector in transparent mode, observability can be very low if multiple Xs are present; the enable input can be switched if the resulting mode (direct-observe or single-fanout XOR), based on the load values of the next pattern, results in higher observability. When simulating transparent mode shift cycles or cycles for which the unload controls (loaded in the next pattern) result in a single-fanout XOR mode, unload values can depend on load values of shorter chains (FIG. 11). If the next pattern is rejected for any reason (such as contention) or if the next pattern does not yet exist, then only transparent mode is enabled for the current pattern. Fault simulation is performed, and only gives detection credit for scan cells which are observable. Secondary target faults with an unobservable detection cell are retargeted for future patterns. There is some risk that primary target faults which require direct-observation modes will not be observable due to competition with care bits of the primary target fault of the next pattern. In this case, it is necessary to insert a dummy pattern to avoid test coverage loss. Since X-tolerance usage limits the ability to use scan cells in the next pattern, the number of merged secondary faults can be decreased, which can increase the total number of patterns.

Low Overhead Scan Insertion Flow

Figure 12:
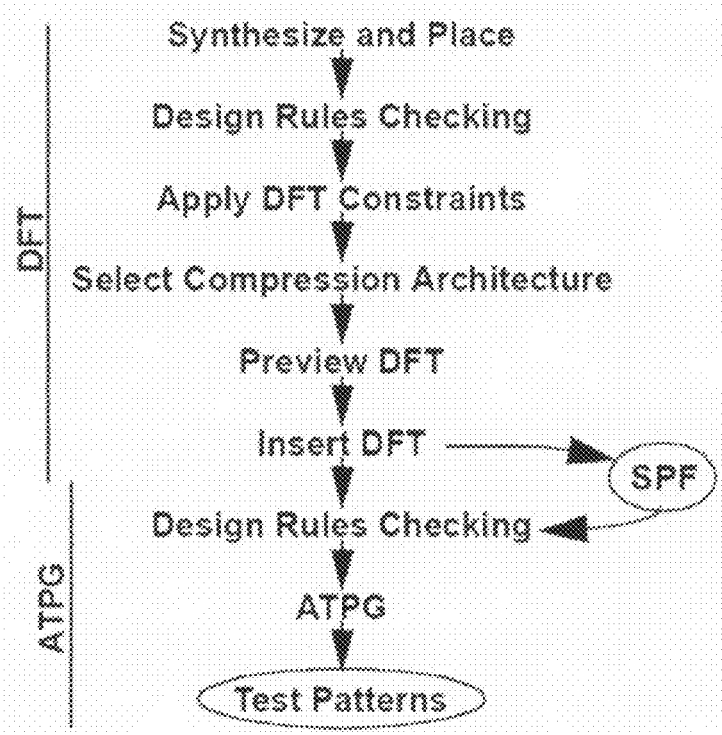
FIG. 12 illustrates, in a flow chart, steps performed in a scan DFT flow in several embodiments of the invention.

Our X-tolerant compression technique introduces only an incremental amount of combinational logic and, since it utilizes regular scan input/output terminals, there is no additional pin overhead on the input and output side of the decompressor and compressor respectively. The low overhead maintains the simplicity of a basic scan insertion process. The insertion flow (FIG. 12) is tightly integrated with proven scan insertion flows requiring very little additional user input. After synthesis, placement and successful RTL level DRC, the user can apply appropriate DFT constraints, such as the number of available scan input/output terminals. Also, the number of scan chains, the compression factor or scan length restrictions can be specified. Next, the compression architecture is selected, either with (FIG. 2A) or without (FIG. 1B) the additional logic to provide 100% Xtolerance. The resulting DFT structures can be pre-viewed and adjusted before committing them to the design.

Architecting, logic insertion and protocol file creation are completely automated. The compressor/decompressor structures, as well as information required to interpret the Xmasking logic at the design interface, are described in the STIL protocol file (SPF). The user can optionally tune the compressor/decompressor parameters or custom-design blocks. The SPF file is regular enough so the user can create a functional description independent of the DFT process. Gate-level DRC is then performed on the DFT-inserted, gate-level netlist, followed by ATPG to create test patterns.

Figure 13:
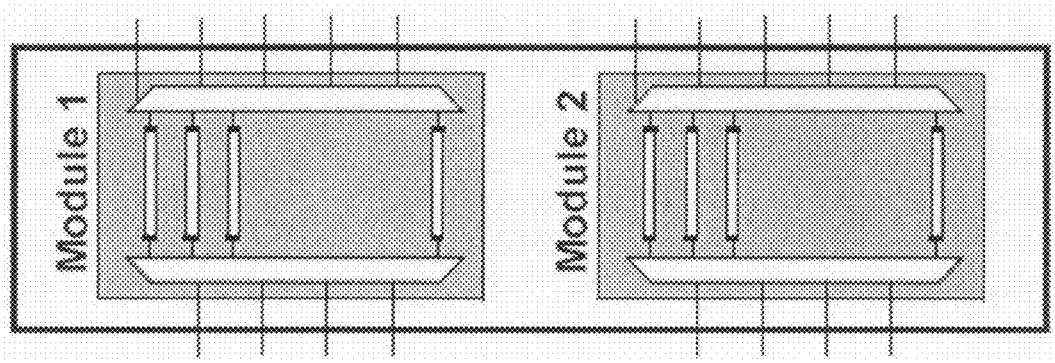
FIG. 13 illustrates a hierarchical architecture as per some embodiments of the invention.
Figure 14:
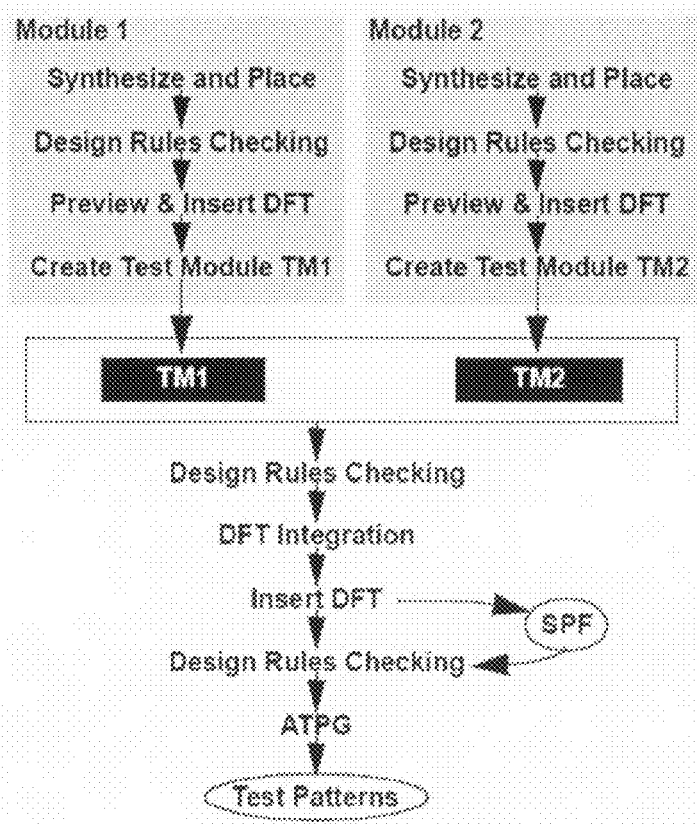
FIG. 14 illustrates, in a flow chart, steps performed in a hierarchical DFT flow in certain embodiments of the invention.

In very large designs, it may not be possible to insert compression logic at the top level without introducing significant routing congestion due to the large number of scan paths. In such cases, a hierarchical approach (FIG. 14) can be adopted by partitioning the design into modules, inserting compression logic at the module-level and then integrating the blocks at the design-level (FIG. 13). The DFT logic in a sub-module can be abstracted in the form of a test model which can be used instead of the full netlist representation of the module during integration. In this case, the modulelevel DFT signals are automatically connected to designlevel ports and information about module-level compression logic is automatically promoted to the design-level protocol file. The module-level compressor/decompressor information for multiple modules will be captured in separate sections in a single design-level protocol file which can then be used for test pattern generation for the design. Module-specific protocol files can also be generated if desired.

Figure 15:
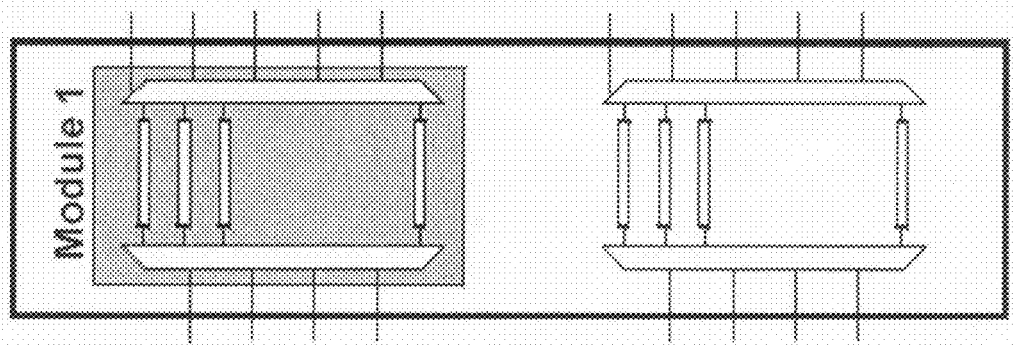
FIG. 15 illustrates a hybrid architecture of some embodiments of the invention.

A variant of the hierarchical flow, termed the hybrid flow, allows insertion of compression logic at the module level and then integrate the modules at the design level while simultaneously inserting compression logic for any top level scan chains (FIG. 15). As before, the user can opt to have the additional logic for 100% X-tolerance at the design or module level. Also, a single protocol file will be generated at the design level capturing details of compression logic at the top and module levels.

Results

The shared compression architecture presented here was implemented in the integrated scan DFT-ATPG flow and applied to 19 industrial designs ranging from 0.5 million to 3.5 million gates, all of which had significant density of Xs. The compression target for these experiments was 10×, so the compressed designs were configured with 12× the number of internal scan chains vs. scan, to allow for a 20% pattern inflation over normal-scan. Data compression exceeded the 10× target for almost all designs for both stuck-at and transition faults. One particular design had slightly lower transition compression due to higher pattern inflation caused by very high X-density, which also caused the large coverage loss unless the fully Xtolerant architecture is used. Cycles compression exceeded the 10× target for all designs due to better balanced scan chain lengths in the compressed flow.

More importantly, results showed only small variations across designs, so the compression method achieves predictable results despite the varied density of Xs. For both stuck-at and transition, the compression ATPG run required, on average, less than twice the time of normal scan ATPG. The increase is due to additional computation necessary to compress load and unload data, additional test-generation activity searching for a load decompressor mode that satisfies all care bits and enables blockage of Xs in the unload selector, and to slower fault dropping due to X-masking, requiring more fault simulation. The total area overhead, including all compression/decompression logic and scan reconfiguration MUXes was only about 1%. Each design was run through the entire DFT scan-insertion flow twice—once with, and once without, compression. The difference in the number of gates was computed and divided by the number of internal chains. For designs smaller than 1 million gates, the total overhead was 1% or higher, whereas for larger designs it is only 0.5% or even lower.

CONCLUSION

We have presented a combinational, fully X-tolerant scan compression method that achieves the test coverage of uncompressed scan even in the presence of very high X-densities. This method is fully integrated in the scan synthesis and test generation flows and has minimal impact on area, timing, and design flow. We extended the previously introduced combinational load decompressor to provide unload controls to a new unload selector which, in conjunction with the unload compressor, ensures 100% X-tolerance. ATPG was enhanced to consider both load care bits and unload selector controls as part of the fault detection process. Predictable 10× data and test application time compressions were demonstrated on industrial designs, with acceptable ATPG time increase, and with no loss of test coverage. Ongoing work addresses higher compression rates for designs with very high X density and/or few pins.

Several embodiments add small, combinational circuits to the inputs and outputs of the internal scan chains, but the design under test remains unmodified—for example, primary inputs (PIs) and primary outputs (POs) need not be wrapped and X-sources in the design need not be blocked (FIG. 2A). A load decompressor designed to minimize dependencies (i.e., two scan chain loading the same value) was implemented with multiplexer gates, so that at every shift a different input sharing configuration can be chosen. The area added by the load decompressor is less than 4 gates per chain in some embodiments. The unload compressor, based on Steiner Triple Systems, was designed to balance compression and X-tolerance while minimizing silicon area. Up to two Xs per shift can be supported with no loss of observability on any other chain; at the same time, the unload compressor enables direct diagnosis and minimizes error aliasing; its area is about 6 gates per chain. However, 2X-tolerant compressors can have lower observability than 1X-tolerant compressors if more than 2 Xs are present. Hence, several embodiments ensure no loss of observability irrespective of the number and distribution of Xs, without resorting to the complexity of sequential compression. Independent of the design, the test set or fault model, our method preserves multiple low-impact aspects of a combinational, scan-based flow.

Accordingly, some embodiments perform a scan compression method by use of a combinational selector which adapts to the number of Xs (per-shift or per-load or full XOR mode). Such embodiments maximize test quality (guarantee test coverage and minimizes pattern count) no matter how many Xs are present, and are designed for minimal impact on area overhead, timing, and design flow. These embodiments are easily adopted on top of existing scan designs, the method is fully integrated in the scan synthesis and test generation flows. Significant data and test time compressions were obtained on industrial designs with negligible overhead and no impact on schedule.

Compressors and selectors of some embodiments are realized in hardware as physical structures on silicon after fabrication of an Integrated Circuit (IC). Software support for such ICs includes design options (such as the number of U and E signals) and DRC and ATPG messages visible to the user.

Several embodiments of the invention achieve the following unexpected results: improve QoR for designs with significant X-masking, provide total X-tolerance when needed, support full compression when possible, minimize circuit overhead, minimize data overhead to control X-tolerance, support per-shift and per-load X-tolerance control, per-shift control for higher compression, per-load control for lower pin count, modes controlled by external pins, and no state elements (resulting in simplicity and low impact). Certain embodiments provide enhanced unload compressor generation (using same circuit for per-shift and per-load), single protocol file for per-shift or per-load (using single load_unload in each section), and support two types of patterns as follows: (1) Full-compression (XOR), no data overhead, and (2) Selective mode (per-shift or per-load).

In some embodiments, unload mode controls are normally defined in test procedure file, and are allowed to be used per-load or per-shift (Ex. 4 unload-mode per-shift [+1 enable per-load] and Ex. 4 unload-mode per-load +1 enable per-shift). Several embodiments provide two ways to select full compression mode (also called "transparent mode"): (1) Enable pin set to 0 and (2) All (non-enable) unload mode pins set to 0. Note that in such embodiments, all other values indicate X-tolerant modes.

Certain embodiments enhance DRC to be only performed when unload mode pins defined. Normal chain I/O inference is performed in such embodiments (setup conditioning assumes all normal unload mode pins set to 0). In these embodiments, normal unload compressor rules are checked (setup conditioning assumes all normal unload mode pins set to 0). In these embodiments, analysis is performed for each X-tolerant mode (setup conditioning sets unload mode pins to associated values; identifies single chain connections to unload compressor outputs; chain connections not defined in test procedure file). Furthermore, in these embodiments, check unload mode control DRC rules (every output must connect to one chain in every X-tolerant mode; every chain must have at least one X-tolerant connection; if per-load control, unload pins cannot be set in load procedure).

Several embodiments also enhance ATPG to store detection scancells (DSs) used for each pattern (distinguish between primary and secondary faults). During good machine simulation, such embodiments identify DSs set to X in full compression mode (DSXs). If pattern has no DSXs: use full compression unload mode for all shifts. If pattern has DSXs (per-shift control): use full compression mode for shifts which don't access DSXs. For shift accessing primary fault DSX, set mode to detect DSX. For all other shifts, set a mode to detect a secondary fault DSX. Enable future test generation for lost secondary faults. If pattern has DSXs (per-load control):(1) set mode to detect primary fault DSX (or a secondary DSX), (2) for other shifts which don't use mode, use full compression mode. and (3) enable future test generation for lost secondary faults. Such embodiments may also set Xs on scancells which lose observability.

Accordingly, in some embodiments, good machine simulation is performed by decoding unload mode control to determine unload values. Moreover, fault simulation is performed by (1) decoding unload mode control to determine observed scancells. and (2) giving detection credit only for observed scancells.

Numerous modifications and adaptations of the embodiments described herein will become apparent to the skilled artisan in view of this disclosure.

Accordingly, numerous modifications and adaptations of the embodiments described herein are encompassed by the scope of the invention.

What is claimed is:

1. An electronic device comprising a circuit, wherein:
said circuit comprises a decompressor, a plurality of scan chains coupled to the decompressor, a selector coupled to the plurality of scan chains, and a compressor coupled to the selector;
the selector comprises a plurality of observation logics;
each observation logic in the plurality of observation logics comprises a single-fanout logic;
at least one observation logic in the plurality of observation logics further comprises a multi-fanout logic;
the selector further comprises a control logic coupled to each single-fanout logic and each multi-fanout logic;
each observation logic is coupled to a scan chain among the plurality of scan chains;
the compressor comprises a plurality of groups of input lines;
each group of input lines comprises a first input line coupled to said single-fanout logic in an observation logic;
at least one group of input lines among said plurality of groups comprises a plurality of second input lines coupled to said multi-fanout logic in said at least one observation logic;
each input line in each group is selectively coupled by the each observation logic coupled thereto, to the scan chain coupled to the observation logic, in response to signals from the control logic.

2. The electronic device of claim 1 wherein:
each single-fanout logic comprises a logic gate of a predetermined type; and
each multi-fanout logic comprises another logic gate of the predetermined type.

3. The electronic device of claim 2 wherein:
the another logic gate has a fanout of 2; and
each group of input lines is 3 in number.

4. The electronic device of claim 1 wherein:
the selector couples every line in each group of input lines to a scan chain, in response to a predetermined value of the signals.

5. The electronic device of claim 1 wherein:
in response to the signals having a first value, at least a first observation logic couples the first input line in a group of input lines coupled to the first observation logic, to a first scan chain coupled thereto, and the first observation logic couples the second input lines in said group of input lines, to a source of predetermined voltage;
in response to the signals having a second value, the first observation logic couples the first input line and the second input lines to the source of predetermined voltage; and
in response to the signals having a third value, the first observation logic couples the first input line and the second input lines to the first scan chain coupled thereto.

6. A computer-implemented method of transferring data to be compressed from a plurality of scan chains in an integrated circuit to a compressor in said integrated circuit, the compressor comprising a plurality of groups of input lines, the method comprising:
the plurality of scan chains supplying the data;
a computer operating each logic among a plurality of logics in said integrated circuit, in one of at least three states in each shift cycle;
wherein each logic is coupled between a scan chain in said plurality of scan chains and a group of input lines of the compressor;
wherein in a first state, said each logic couples a first input line in a group of input lines within said plurality of groups of input lines, to a scan chain in said plurality of scan chains, and further couples a set of second input lines in said group of input lines to a source of predetermined voltage;
wherein in a second state, said each logic couples the first input line and the set of second input lines to a source of predetermined voltage;
wherein in a third state, said each logic couples the first input line and the set of second input lines to said scan chain; and
the compressor receiving a result of said plurality of logics processing the data supplied by the plurality of scan chains.

7. The method of claim 6 wherein:
said operating is performed combinationally without use of memory.

8. The method of claim 6 wherein:
in one shift cycle, all logics are operated in said first state; and
in another shift cycle all logics are operated in said second state.

9. The method of claim 6 wherein:
in one shift cycle, a first logic is operated in said first state and a second logic is operated in said second state; and
in another shift cycle, the first logic is operated in said second state and the second logic is operated in said first state.

10. An electronic device comprising a circuit, said circuit comprising:
a selector coupled to a plurality of scan chains in said electronic device and;
a compressor comprises a plurality of groups of input lines;
wherein each group of input lines comprises a first input line coupled individually to said selector and a plurality of second input lines coupled in a fanout to said selector;
wherein in a first mode, said selector couples all input lines to corresponding scan chains;
wherein in a second mode, said selector couples said first input lines to corresponding scan chains and couples said second input lines to a source of predetermined voltage.

11. The electronic device of claim 10 wherein:
in a plurality of third modes, said selector couples selected said first input lines to corresponding scan chains and couples all remaining input lines to a source of predetermined voltage.

12. A computer-implemented method of modifying integrated circuit (IC) designs, the method comprising:
receiving an IC design;
a computer transforming the IC design at least by adding therein a combinational decompressor, a combinational selector coupled between the combinational decompressor and a plurality of scan chains pre-existing in the IC design, and a combinational compressor coupled to the combinational selector; and
storing in memory, a transformed design resulting from said transforming.

13. The method of claim 12 wherein the combinational compressor comprises a plurality of output lines, each output line receiving a result of overlapping data from a group of chains of scan cells, each output line being coupled to a predetermined set of chains in a first mode of operation of the combinational selector, the method comprising:
defining each mode m among a group of second modes of operation of the combinational selector by repeatedly performing for each mode m, until all chains are connected:
setting q to an output line not used in mode m if said output has fewest chains;
setting c to a chain not used in mode m if said chain is coupled to fewest output lines;
connecting q to c in mode m; and
if all output lines are used in mode m, incrementing mode m.

14. The method of claim 12 wherein the combinational selector comprises a plurality of unload control lines, each unload control line receiving a signal from a primary input, the method comprising:
identifying primary inputs to be coupled to unload control lines by use of a local-minimization heuristic with a cost function to fill a cost table by repeatedly performing, for each load mode Lm and for each unload control signal u:
setting r to a row in the cost table with lowest sum of costs and lowest usage of primary inputs;
connecting unload control u to primary input r in load mode Lm; and
increasing cost in the cost table, for each pair of primary inputs used.

15. A computer-readable storage medium comprising software code that when executed, causes a computer to modify integrated circuit (IC) designs, the software code comprising:
code for receiving an IC design;
code for transforming the IC design at least by adding therein a combinational decompressor, a combinational selector coupled between the combinational decompressor and a plurality of scan chains pre-existing in the IC design, and a combinational compressor coupled to the combinational selector; and
code for storing in memory, a transformed design resulting from execution of said code for transforming.

16. The computer-readable storage medium of claim 15 wherein the combinational compressor comprises a plurality of output lines, each output line receiving a result of overlapping data from a group of chains of scan cells, each output line being coupled to a predetermined set of chains in a first mode of operation of the combinational selector, the software code further comprising:
code for defining each mode m among a group of second modes of operation of the combinational selector by repeatedly performing for each mode m, until all chains are connected:
setting q to an output line not used in mode m if said output has fewest chains;
setting c to a chain not used in mode m if said chain is coupled to fewest output lines;
connecting q to c in mode m; and
if all output lines are used in mode m, incrementing mode m.

17. The computer-readable storage medium of claim 15 wherein the combinational selector comprises a plurality of unload control lines, each unload control line receiving a signal from a primary input, the software code further comprising:
code for identifying primary inputs to be coupled to unload control lines by use of a local-minimization heuristic with a cost function to fill a cost table by repeatedly performing, for each load mode Lm and for each unload control signal u:
setting r to a row in the cost table with lowest sum of costs and lowest usage of primary inputs;
connecting unload control u to primary input r in load mode Lm; and
increasing cost in the cost table, for each pair of primary inputs used.

* * * * *